United States Patent
Campinoti et al.

(10) Patent No.: US 11,645,140 B2
(45) Date of Patent: May 9, 2023

(54) QUANTITATIVE ANALYSIS AND DIAGNOSTIC COVERAGE (DC) CALCULATION OF APPLICATION-ORIENTED SAFETY MEASURES IN COMPLEX SYSTEMS

(71) Applicant: Intel Corporation, Santa Clara, CA (US)

(72) Inventors: Alessandro Campinoti, Pisa (IT); Giuseppe Capodanno, Lucca (IT); Nabajit Deka, Bangalore (IN); Prashanth R. Gadila, Hyderabad (IN); Elisa Spano, Vicopisano (IT)

(73) Assignee: Intel Corporation, Santa Clara, CA (US)

( * ) Notice: Subject to any disclaimer, the term of this patent is extended or adjusted under 35 U.S.C. 154(b) by 37 days.

(21) Appl. No.: 17/409,343

(22) Filed: Aug. 23, 2021

(65) Prior Publication Data

US 2022/0091917 A1 Mar. 24, 2022

Related U.S. Application Data

(63) Continuation of application No. PCT/IT2020/000067, filed on Sep. 24, 2020.

(51) Int. Cl.
*G06F 11/07* (2006.01)
(52) U.S. Cl.
CPC .......... *G06F 11/079* (2013.01); *G06F 11/076* (2013.01)
(58) Field of Classification Search
CPC ............................. G06F 11/079; G06F 11/076
See application file for complete search history.

(56) References Cited

U.S. PATENT DOCUMENTS

| | | | |
|---|---|---|---|
| 11,409,930 B2* | 8/2022 | Cefalo | G06F 30/30 |
| 2008/0034258 A1 | 2/2008 | Moriya et al. | |
| 2008/0276206 A1 | 11/2008 | Mariani | |
| 2014/0200699 A1 | 7/2014 | Vincelli et al. | |
| 2019/0050300 A1* | 2/2019 | Cagnacci | G06F 11/1629 |
| 2019/0324422 A1 | 10/2019 | Capodanno et al. | |
| 2020/0081758 A1 | 3/2020 | Vincelli et al. | |

FOREIGN PATENT DOCUMENTS

WO 2019134762 A1 7/2019

OTHER PUBLICATIONS

May 28, 2021—(PCT) International Search Report—App. PCT/IT2020/000067.

* cited by examiner

*Primary Examiner* — Nadeem Iqbal
(74) *Attorney, Agent, or Firm* — Banner & Witcoff Ltd.

(57) ABSTRACT

Techniques are disclosed for combining diagnostic features at different levels (with a special consideration of the application-oriented measures) though a quantitative analysis that provides evidence supporting a claimed diagnostic coverage (DC) calculation for circuits to meet defined functional safety standards. These techniques implement a parametrized approach to allow tuning by a system integrator according to its specific software application environment. The required safety level or DC goals may thus be attained based upon the results of the safety analysis (and failure rates) provided by a device manufacturer.

24 Claims, 16 Drawing Sheets

| SW component HW FM | $\lambda_{D\_App} = \lambda_{DU\_noApp}$ | Customer Safety App | SMC library | OS & Middleware | SW test library | Non-Safety Related App |
|---|---|---|---|---|---|---|
| FM 1 | $\lambda_{DU\_noApp1}$ | % | % | % | % | % |
| FM 2 | $\lambda_{DU\_noApp2}$ | % | % | % | % | % |
| ... | | | | | | |
| ... | | | | | | |
| FM # | $\lambda_{DU\_noApp\#}$ | % | % | % | % | % |

FIG. 5

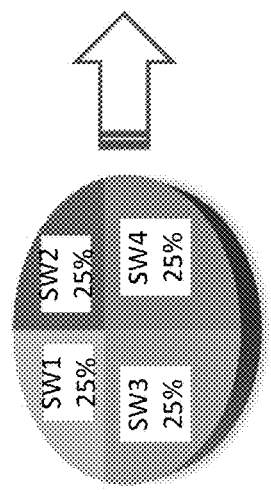
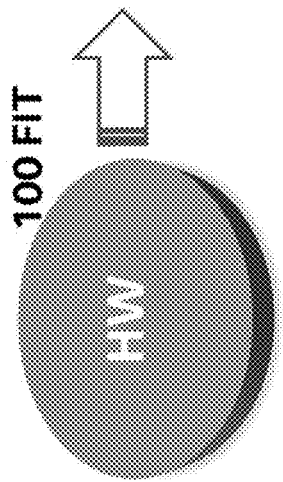
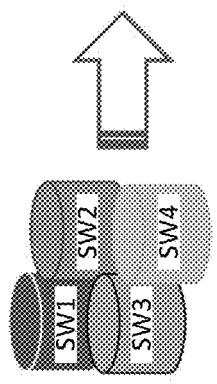
FIG. 6A
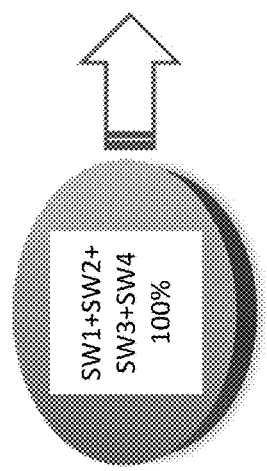
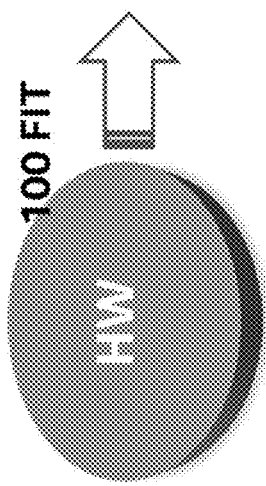
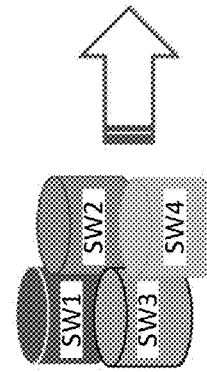
FIG. 6B

| FM_ID | HW component | HW Failure mode | End Effect on the safety function | FMD% | Diagnostic mechanism | DC (HW only) | λ_ |
|---|---|---|---|---|---|---|---|
| Core_FM1 | Front End – Fetch, Decode | Incorrect sequencing or decode of instructions | Wrong execution of safety application or Delayed execution | 10% | none | 0% | 10 |
| Core_FM2 | Front end – Cache | Data corruption in Instruction cache | wrong execution of safety application | 10% | ECC or Parity + retry | 99% | 0.1 |
| Core_FM3 | Front end – Branch prediction | Incorrect prediction of branches | delayed execution of safety application | 5% | none | 0% | 5 |
| Core_FM4 | Execution units | Incorrect execution of instructions | wrong execution of safety application or incorrect Memory management | 25% | None | 0% | 25 |
| Core_FM5 | L1 data cache | Data corruption in Data cache | wrong execution of safety application | 40% | ECC or Parity + retry | 99% | 0.4 |
| Core_FM6 | Memory Management Unit | Stuck at faults in memory management | incorrect Memory management | 10% | None | 0% | 10 |

| FM_ID | HW component | EE_1=Wrong execution | EE_2=Delayed execution | EE_3=Wrong memory management |
|---|---|---|---|---|
| Core_FM1 | Front End – Fetch, Decode | 50% | 0% | 50% |
| Core_FM2 | Front end – Cache | 100% | 0% | 0% |
| Core_FM3 | Front end – Branch prediction | 0% | 100% | 0% |
| Core_FM4 | Execution units | 50% | 0% | 50% |
| Core_FM5 | L1 data cache | 100% | 0% | 0% |
| Core_FM6 | Memory Management Unit | 0% | 0% | 100% |

| FM_ID | Failure modes from End Effect on the safety function | $\lambda_{DU\_NoApp}$ |
|---|---|---|
| EE_1 | Wrong execution | 18.00 |
| EE_2 | Delayed execution | 5.00 |
| EE_3 | Incorrect memory management | 27.50 |
| *Total* | | *50.5* |

| FM_ID | FM name | SW component | | Redundant SW | Common SW | Diagnostic SW |
|---|---|---|---|---|---|---|
| | | | $\lambda_{D\_App}=\lambda_{DU\_noApp}$ | | | |
| EE_1 | Wrong execution | | 18 | 0.3% | 0.3% | 0.3% |
| EE_2 | Delayed execution | | 5 | 0.3% | 0.3% | 0.3% |
| EE_3 | Wrong memory management | | 27.5 | 0.3% | 0.3% | 0.3% |

FIG. 13

| FM_ID | Description of the HW FM impact on Redundant execution of SW components (Customer Safety App) | EE 1 SW FMD% | EE 2 SW FMD% | EE 3 SW FMD% | Diagnostic mechanism | DC |
|---|---|---|---|---|---|---|
| SW_FM1 | No effect or delay (less than PST) to SW element | 0% | 0% | 0% | None | 0% |
| SW_FM2 | Failure cases redundant copies of Safety App produce different outputs. | 60% | 0% | 40% | ODCC comp | Determined by equality of the comparison |
| SW_FM3 | Failure cases copies of Safety App produce incorrect identical outputs | 0% | 0% | 60% | None | 0% |
| SW_FM4 | Failure cases stall of significant delay in one or both copies of the safety App | 40% | 100% | 0% | ODCC timeout | Determined by the efficiency of timeout monitors |

| Parameter | Value |
|---|---|
| $\dfrac{D_{comp}}{D_{out}}$ | 100% |
| $\dfrac{V_{comp}}{V_{SR}}$ | 90% |
| $\varepsilon$ | 0.1 |
| Pue signature (CRC32) | $2^{-32}$ |

QUANTITATIVE ANALYSIS AND DIAGNOSTIC COVERAGE (DC) CALCULATION OF APPLICATION-ORIENTED SAFETY MEASURES IN COMPLEX SYSTEMS

TECHNICAL FIELD

This disclosure generally relates to techniques for calculating diagnostic coverage (DC) for complex systems and, more particularly, to techniques that combine diagnostic features at different levels while considering application-oriented measures for failures detection via a quantitative analysis to support a claimed diagnostic coverage (DC) calculation.

BACKGROUND

The diagnostic capability of modern complex systems (e.g. multi-core processing systems) employed in safety critical environments is often achieved by means of a heterogeneous combination of diagnostics operating at different levels of hardware (HW) abstraction, and is in part configured to a specific use case with respect to a specific application that is executed by the processing element. The coexistence of hardware integrity features, hardware monitors, diagnostic tests (either at the hardware (HW) or software (SW) level), application monitors, and HW or SW redundant computation makes the determination of the total achievable diagnostic coverage (DC) a difficult operation. This is mainly due to the presence of complex inter-dependency and overlap among the multiple measures. Existing techniques and methods for safety analysis and DC calculation are described by functional safety standards with examples for stand-alone diagnostics. However, such standards lack a clear methodology to combine the different contributions of heterogeneous HW/SW diagnostics for the calculation of functional safety indicators.

Further complicating this issue for quantifying DC in such situations is the fact that the device vendors have better understanding of underlying failure modes (FM), failures in time (FIT) rates, and silicon safety measures. However, the system integrator is in a better position to judge application-level failure effects and the appropriate level of application-oriented safety measures.

BRIEF DESCRIPTION OF THE FIGURES

The accompanying drawings, which are incorporated herein and form a part of the specification, illustrate the aspects of the present disclosure and, together with the description, and further serve to explain the principles of the aspects and to enable a person skilled in the pertinent art to make and use the aspects.

FIG. 5 illustrates an example of mapping of the failures that are undetected after a hardware FMEDA analysis, in accordance with one or more aspects of the present disclosure.

FIGS. 6A and 6B illustrate examples of different approaches for determining permanent failure rate distributions, in accordance with one or more aspects of the present disclosure.

FIG. 10 illustrates an example table representing hardware FMEDA for one of the cores of the dual core processor as shown in FIG. 9 with failure modes and distribution, in accordance with one or more aspects of the present disclosure.

FIG. 11 illustrates an example table representing hardware failure mode distribution end effects for one of the cores of the dual core processor as shown in FIG. 9, in accordance with one or more aspects of the present disclosure.

FIG. 12 illustrates an example table representing residual FIT distribution for each end effect as shown in the Table of FIG. 11, in accordance with one or more aspects of the present disclosure.

FIG. 13 illustrates an example table representing hardware failure mode undetected failure rates allocation to software component classes, in accordance with one or more aspects of the present disclosure.

FIG. 14 illustrates an example table representing examples of software-based FMEDA for a reference use case using comparison by software, in accordance with one or more aspects of the present disclosure.

FIG. 15 illustrates an example table representing the parameters used to calculate the on demand cross comparison (ODCC) diagnostic coverage (DC) estimate, in accordance with one or more aspects of the present disclosure.

The exemplary aspects of the present disclosure will be described with reference to the accompanying drawings. The drawing in which an element first appears is typically indicated by the leftmost digit(s) in the corresponding reference number.

DETAILED DESCRIPTION

Figure 1:
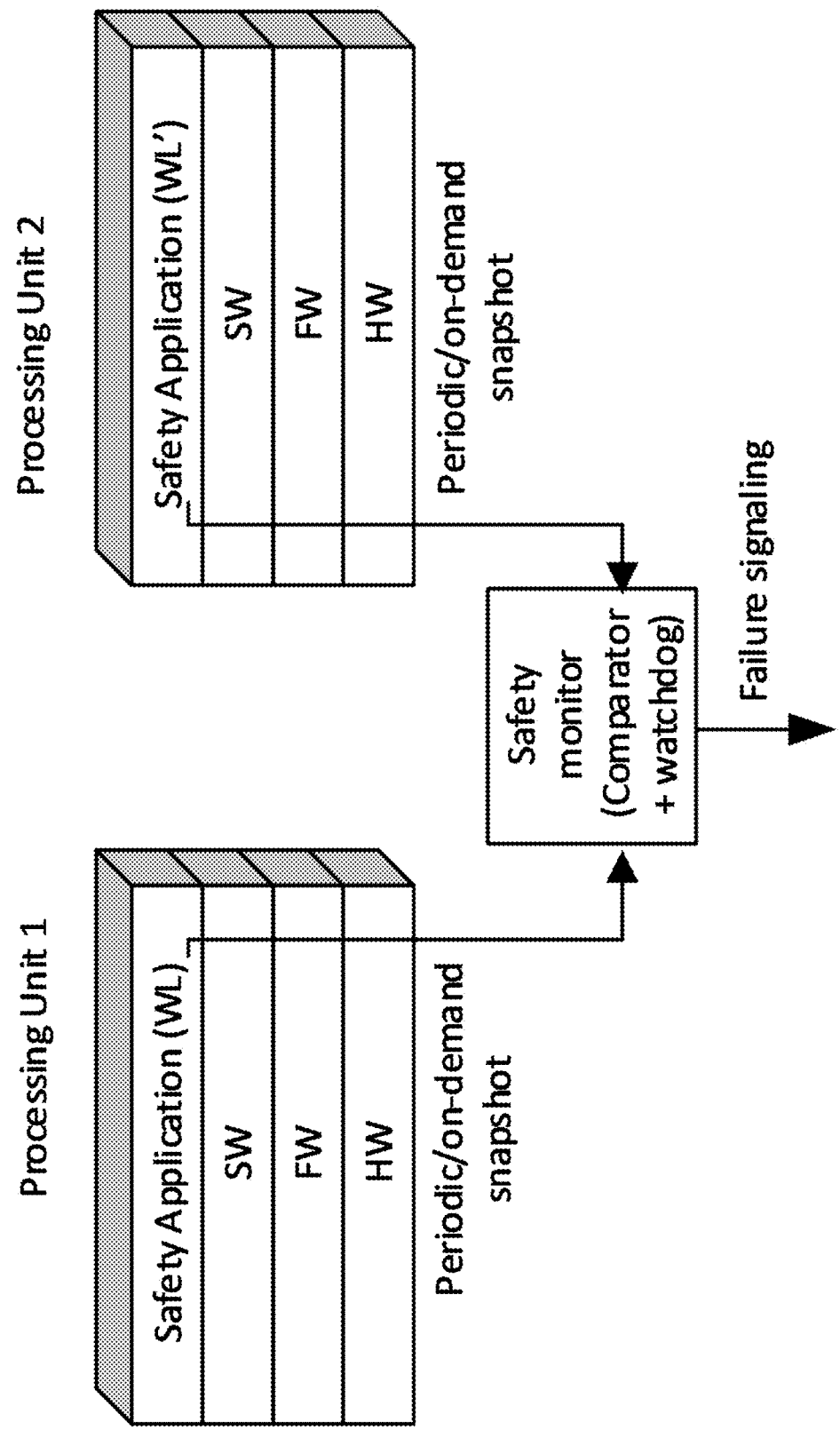
FIG. 1 illustrates an example of the concept of application redundancy and SW comparison via a third agent.

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

So called E/E systems are used in a context in which failures or malfunctions can generate dangerous conditions potentially causing harm, and thus must be designed in compliance with applicable Functional Safety standards such as IEC61508 or its adaptation/variant for specific fields (e.g. ISO26262 for automotive applications). Such standards prescribe, among other requirements, that each element (e.g. device) of an electronic system be capable of detecting HW failures affecting the intended functionality, up to a level defined by the Safety Integrity Level (SIL) of that element. The minimum achievable SIL is determined by the diagnostic coverage (DC) of the combination of all the applicable diagnostics checking the device functionality and integrity.

In modern complex systems, and in particular in multi-core processing elements, the diagnostic capability is often achieved by means of a heterogeneous combination of diagnostic features operating at different abstraction levels (e.g. HW integrity features, HW monitors, HW and/or diagnostic tests, application monitors and redundant computation, etc.) and in part oriented to a specific use case (e.g. a specific application executed by the processing element). This combination, which is required due to the complexity of the element, makes the determination of the total achievable DC a difficult operation. In fact, although existing techniques and methods are described by functional safety standards, additional considerations and methodologies are required to combine the contribution of heterogeneous HW/SW diagnostics in a meaningful and justifiable way.

In addition, a device manufacturer does not know the specific use case of the final system in which a device will be employed. Therefore, if these specific use case details have an impact on the DC determination, the methodology needs to establish a means for the final user to evaluate the effect of the constraints to the calculation without having to perform a new evaluation or breaking the standards compliance for the device offered by the manufacturer/supplier.

Thus, and as noted above, conventional functional safety standards lack a clear methodology to combine different contributions of heterogeneous HW/SW diagnostics for the calculation of functional safety indicators. Previous attempts to address this issue are only directed to specific aspects or architectures, do not provide a comprehensive solution, and do not allow for the ability for automated and/or scaling to multiple designs, or cases in which heterogeneous solutions coexist. Furthermore, current techniques do not provide methods to optimize application-oriented SW measures in consideration of specific user parameters. In contrast, the aspects described herein may implement the application of suitable diagnostics of safety-based applications, such as reciprocal cross-comparison by software for example, which helps optimize what to compare, how frequently to compare, how much protection needs to be guaranteed by other measures, etc.

Another drawback of the current approaches is the failure to consider the impact to DC of running customer applications, as the HW failure modes and failures in time (FIT) are not associated with these applications. Still further, none of the previous solutions provide a quick yet exhaustive procedure for safety analysis in which application-oriented measures are applied to complex processing units. To address these shortcomings, the aspects described herein propose a methodology to combine diagnostic features at different levels (with a special consideration of the application-oriented measures) though a quantitative analysis that provides evidence supporting the claimed DC. Moreover, the aspects described herein implement a parametrized approach to allow a system integrator to tune it according to a specific SW application environment. Thus, the required safety level or DC goals may be attained based upon the results of the safety analysis (and failure rates) provided by a device manufacturer. The aspects described herein also provide an overall framework by defining a procedure to perform a safety analysis with specific steps, and allow for alternative approaches or use of different previous solutions.

As further discussed herein, the aspects are directed to a solution that may be implemented in accordance with a functional safety analysis of complex processing systems such as a system on a chip (SoC), for example. The aspects described herein thus describe a methodology to compute failure rates and diagnostic coverage metrics. These techniques demonstrate compliance with functional safety requirements in cases in which application-oriented SW measures are applied to processing units in combination of other HW/SW measures to mitigate risk due to HW random failures in electronic controller devices.

The aspects described herein enable the failure rate allocation from HW to SW components. That is, the proposed methodology enables a quantitative measurement of the effect of HW failures to SW components and the determination of the associated failure rates using criteria that can be parametrized and embedded in a tool. Furthermore, the aspects described herein enable the classification of the SW components and effect analysis of SW failure modes. In other words, the proposed methodology enables the definition of equivalent classes of SW components to simplify the analysis of the effect of failures. This allows for the performance of a safety analysis without knowledge of the details of the SW components so that the analysis may be performed by the device manufacturer and later tuned by a system integrator.

Still further, the aspects as described herein enable the quantitative evaluation of the quality of the diagnostic. In particular, the proposed methodology enables an estimation of the quality of the application-oriented diagnostics with respect to the parameters that could reduce its diagnostic capability and the computation of the resulting overall diagnostic coverage provided by the application-oriented mitigations. Also, the techniques discussed herein enable the evaluation of the safety indicators from all diagnostics combined. This calculation leads to determinations of the safety indicators required by diagnostic standards (DC, residual failure rate, etc.) from all the combined measures, enabling further adaptation and tuning/optimization to be performed by the customer to fit a specific usage and need.

Thus, the aspects described herein provide a reusable and scalable approach to measure the efficiency of application-oriented SW mitigations in achieving safety of SoC or other complex processing systems, which offers customers the possibility of tuning a specific solution using application-specific parameters, keeping the safety concept provided the device manufacturer or device supplier unmodified. The aspects also advantageously provide a methodology enabling the assessment of functional safety performance of devices that can be used by external auditors to achieve certification of compliance to safety standards. Moreover, this methodology may be extended to customers to prove the safety integrity level achieved on their use case, which is based on quantitative data provided by the device manufacturer. This also allows for a quantitative solution that can be incorporated into a tool that is provided to customers to optimize their specific use-case parameters.

Application-Oriented Safety Architecture, Case Study: Reciprocal Cross-Comparison by SW The strategy used to build an architecture of diagnostic components capable of achieving a safety integrity target for a modern electronic device typically requires several different types of HW and SW monitors to be combined:

1. HW integrity features such as error-correcting code (ECC) in memory arrays, built-in self tests (BISTs), parity added to bus payloads to protect the communication, HW monitors (e.g. clock/temperature/voltage monitors), etc.

2. SW diagnostics of HW functionality such as SW test libraries that are periodically executing to monitor the HW integrity.

3. Application-oriented SW measures such as SW redundancy of safety tasks or execution flow and/or timing monitors.

There are many application-oriented SW measures that could be applied to processing units to mitigate the risk due to HW random failures in electronic controller devices. The aspects described herein consider all factors that could impact the DC of an application-oriented SW measure, and address how to combine the claimed DC with the DC of the HW and SW diagnostics. However, prior to discussing the aspects in further detail below, the discussion of an example reference use case is first warranted to provide additional clarity with respect to an example implementation of the aforementioned safety monitoring solutions. This example is discussed further with reference to FIG. 1 by way of example and not limitation, which illustrates the concept of application redundancy and SW comparison via a third agent. The aspects described herein reference this example use case for brevity and ease of explanation, although the aspects described herein are not limited to this particular example and may be applied in accordance with any suitable type of safety-based application diagnostic architecture. For example, the aspects described herein may also be implemented in accordance with other software-based solutions for failure detection such as SW coded processing, end-to-end (E2E) safety communication protocols, etc.

This example use case is described with reference to a safety architecture based on application-oriented SW redundancy and dynamic comparison (reciprocal cross-comparison by SW or comparison made by a third agent in the system). For such an architecture, safety relevant software data (including results, intermediate results and test data) from redundant execution of the safety application allocated to independent HW processing units are compressed into a signature and compared periodically or on-demand. A safety monitor is responsible for executing the comparison of the corresponding data packets from the two instances and implementing the watchdog timers required to ensure that the data are received and compared with the expected cadence. Detected differences in the behavior of the processors (e.g. data mismatch, delayed or missing arrival, incorrect ordering, etc.) lead to a failure being signaled. This technique may be referred to herein as an "on Demand cross comparison" (ODCC) solution. The calculation methodology explained using this example may also apply in the case of implementing a safety monitor in the processing units itself (i.e. both, with redundancy in order to avoid common-cause failures from one core preventing the comparison to take place).

Such safety architecture can also offer compliance with various safety requirements, such as Cat. 3 and Cat. 4 of the ISO 13849 standard for the design and integration of safety-related parts of control systems (SRP/CS). In general terms, the diagnostic coverage associated with this diagnostic technique mainly depends on the standard defined in ISO 26262-5, D.1, which includes:

1. The probability of the failure modes, based on the hardware in the system;

2. The capability to cover the processing unit failure modes;

3. The specific implementation of the safety mechanism/diagnostic technique; and 4. The execution timing of the safety mechanism (periodicity).

In the case of reciprocal cross-comparison by SW or comparison made by a third agent in the system, the IEC 61508 standard states that the maximum diagnostic coverage achievable is "high" (meaning up to 99% failures are detected) depending on the "quality of the comparison," but does not provide any guidance on how to determine the quality of the comparison in a quantifiable way. Thus, the aspects as described herein identify a methodology that allows a quantitative determination to be made of the achievable DC in consideration of measurable system parameters. This may then be "tuned" by a system integrator in accordance with a specific use case based upon the device safety characterization (failure modes and associated failure rates) made by the supplier.

Diagnostic Coverage Computation Methodology Overview

Several known industry methods and procedures exists to evaluate the DC of HW and SW measures. For instance, Failure Mode and Effects Analysis (FMEA) is a structured approach to discovering potential failures that may exist within the design of a product or process. FMEA is often used to evaluate SW components, and provides a means to systematically evaluate the effect of failures in a qualitative manner. Another approach includes failure modes, effects, and diagnostic analysis (FMEDA), which is a systematic analysis technique to obtain subsystem/product level failure rates, failure modes, and diagnostic capability. FMEDA is generally more suitable for a HW-oriented view and offers a quantitative mean to calculate failure rates and Diagnostic Coverage (DC), enabling the quantification of the probability of failures in the HW parts/subparts that are the base functional elements on which the application executes (e.g. in a common SoC, compute cores, cache memories, bus interconnects, I/O devices, etc.).

However, to correctly estimate the DC provided by the individual measures (HW and SW) and to combine these together in the case of complex embedded systems, both the HW and SW (application) views need to be represented and combined in a single methodology for safety analysis and DC calculation. Therefore, the aspects described herein are directed to a methodology that combines components of HW FMEDA and SW FMEA. The aspects described herein also define a procedure to evaluate the DC coverage of a mixed HW/SW-defined safety architecture implementing application-oriented diagnostics, such as redundancy and cross-comparison by SW (or comparison by a third player) in multicore processing.

The aspects discussed further below define the steps that enable the computation of the DC of application-oriented software measures with respect to failures of specific portions of hardware. These aspects consider both the efficiency in detecting failures in the underlying hardware elements of the diagnostic implemented at application-oriented diagnostics, as well as a quantitative evaluation of the effect of common cause failures or dependent failures that may affect the capability of detection for each diagnostic mechanism.

The aspects described herein function to create a quantitative relationship between a probability associated with an occurrence of a random failure on a certain portion of the hardware and its effect in terms of failure of the safety-related application implemented by software components executing on that hardware. In particular, the probability of an occurrence of a failure affecting certain software components is estimated, and the effect of such a failure is evaluated with respect to a violation of the final goal of the safety function (represented by the specific safety application under execution).

Figure 2:
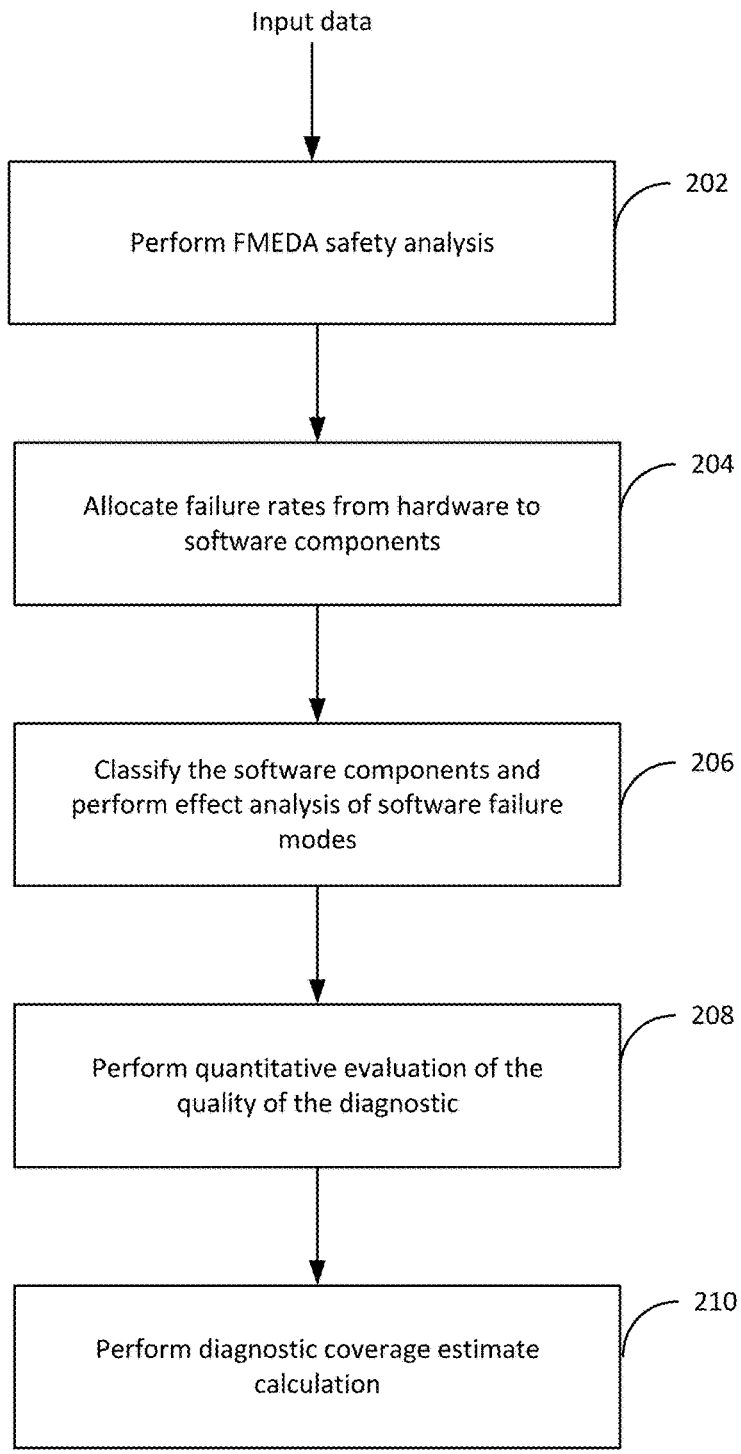
FIG. 2 illustrates an example method flow for calculating the diagnostic coverage (DC), in accordance with one or more aspects of the present disclosure.

As discussed in further detail herein, a precondition to perform such analysis is the knowledge of (1) the safety architecture implemented (in the example case based on redundant execution of the SW safety application), (2) different SW components involved or running at the same time on the same HW, and (3) reciprocal relationships and dependencies. An overview of the methodology used to calculate the DC in accordance with the aspects described herein is shown in FIG. 2. Each of the stages shown in FIG. 2 is discussed further below.

Phase 202: Hardware Safety Analysis and Residual Failure Rate Calculation Trough FMEDA The method 200 begins at phase 202 in which an FMEDA safety analysis is performed. In an aspect, phase 202 may be implemented in a substantially similar or identical manner implementing an FMEDA analysis in accordance with known and/or defined standards, as discussed above. Thus, phase 202 may receive as an input data representing any suitable representation of a particular system, processing unit, SoC, circuit design, etc., that is to be subjected to a safety analysis and for which a DC calculation is to be determined. For example, the input data shown in FIG. 2 may represent any suitable data representation of a designed system that identifies the hardware components such as a netlist, a digitized block diagram, etc. The input data may also include, for instance, a probability of failures associated with the technology for the circuit design (e.g. silicon). That is, regardless of the particular circuit design that is represented by the input data, the circuit design is configured to execute one or more safety-based applications for which a DC calculation is to be calculated, which may involve the use of one or more software components and one or more hardware components. In the example use case, this safety-based application is diagnosed in accordance with the redundant cross-comparison technique as discussed above with respect to FIG. 1, although again this is by way of example and not limitation. For instance, the aspects described herein evaluate a combined DC contribution from several type of diagnostics, which may include, but is not limited to, the redundant cross-comparison technique. For example, and as further discussed below, the first phase of this process is dedicated to the evaluation of HW-oriented diagnostic measures, with additional measures considered in the additional phases.

As shown in FIG. 2, phase 202 includes performing an FMEDA safety analysis from a hardware perspective, which allows for the identification and/or definition of safety-related hardware elements, the associated hardware failure modes, and failure rates. Thus, aspects include phase 200 representing the performance of a FMEDA safety analysis of the hardware used to execute a particular safety application. For example, is IEC 61508 is used as a reference standard, then failure modes such as "No-Effect," "Safe," or "Dangerous" may be identified for a particular system under test based upon the considerations about the end effect of the failure with respect to the hardware elements under analysis.

Figure 3:
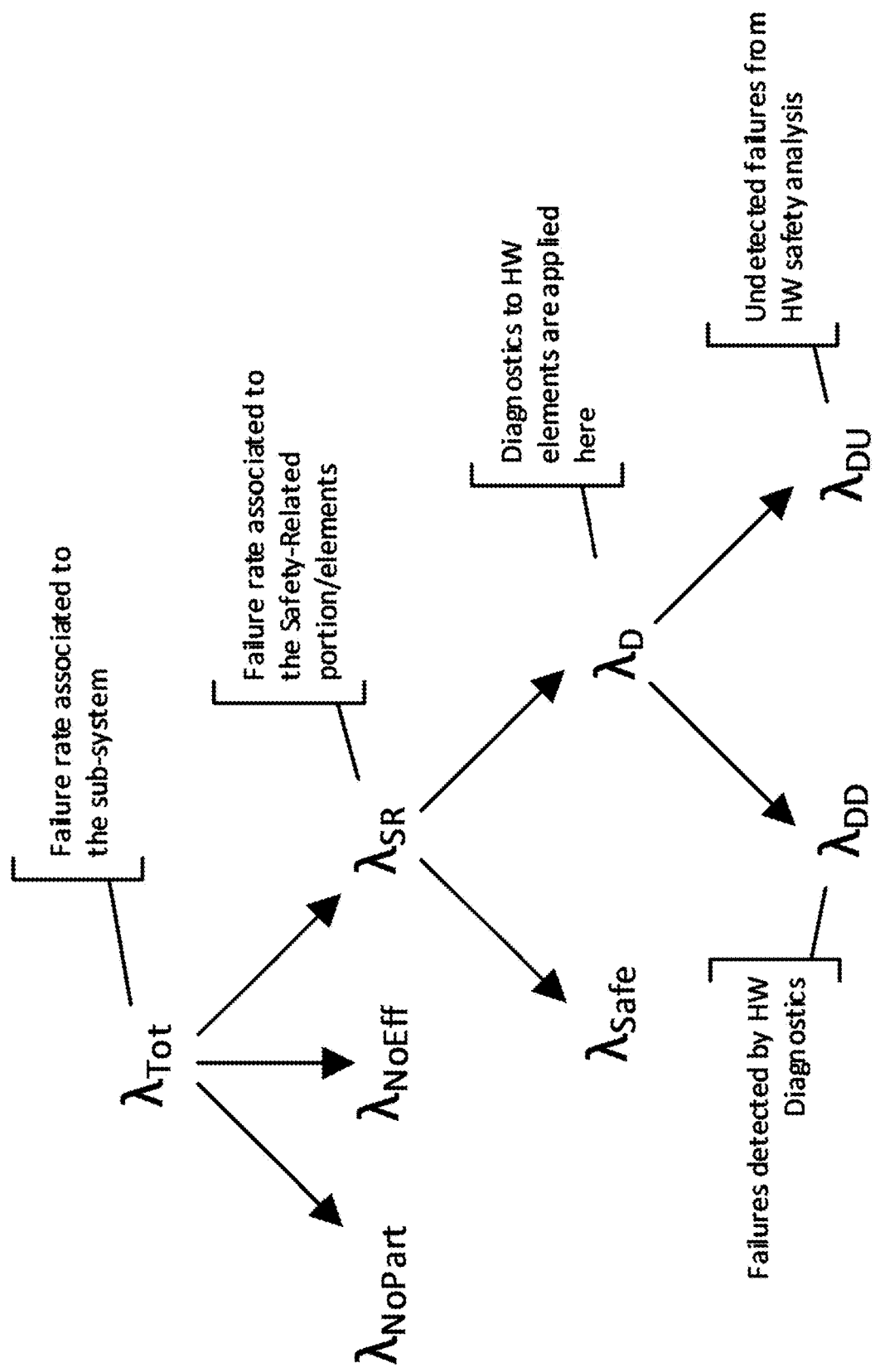
FIG. 3 illustrates an example of failure rate distribution according to the IEC 61508 standard.

An example representation of such an analysis is shown graphically in FIG. 3, which uses the terminology consistent with the IEC 61508 standard by way of example and not limitation, as the aspects described herein may also be implemented in accordance with ISO 13849 and ISO 26262, for instance, or any other suitable defined standard or protocol, which may or may not be a standardized protocol.

During phase 202, aspects include performing an evaluation of the residual probability of undetected HW failures that may affect the execution of the software associated with the safety-based application by including all available hardware-based diagnostic measures. That is, the hardware dangerous failure rate ($\lambda D$) is analyzed with respect to the existing diagnostics, with the aim of testing the hardware functions (e.g. ECC or other HW checks, but also BISTs or SW tests of HW logic).

Together with hardware diagnostics, aspects include the FMEDA safety analysis that is performed during phase 202 accounting for diagnostic coverage contributions from available SW diagnostics of HW functionality, such as periodically executed software-based functional tests, for instance, to determine a total hardware dangerous detected failure rates ($\lambda DD$) and residual hardware dangerous undetected failure rates ($\lambda DU\_noApp$) for each failure mode of defined hardware parts/sub-parts. This may be performed in accordance with any suitable techniques, such as known techniques used in accordance with FMEDA methodology, for instance. In other words, the hardware-based analysis in phase 202 functions to analyze the one or more hardware components used in conjunction with the execution of a safety application to determine, for a predefined set of failure modes (e.g., "No-Effect," "Safe," or "Dangerous," etc.) both a set of detected hardware failures ($\lambda DD$) and a set of undetected hardware failures ($\lambda DU\_noApp$ or $\lambda DU$).

In an aspect, the analysis performed in phase 202 may be done without considering the specific details of the software architecture or the application-oriented software diagnostics (e.g. the comparison by software in the example use case). This leads to a first safety characterization of the hardware device that can be provided. However, residual undetected failures from hardware FMEDA analysis ($\lambda DU\_NoApp$) are to be considered to compute the additional contribution (in terms of diagnostic coverage) of the application-oriented diagnostic measures, as further discussed below. The hardware FMEDA analysis requires a deep knowledge of the underlying hardware and its failure distribution, which are generally based upon reliability data from the specific design and the technology process (e.g. the input data). This analysis may be performed, for instance, by a silicon vendor and/or on SoC products designated for use in applications where functional safety is a concern.

Phase 204: Failure Rates Allocation from Hardware to Software Components

In an aspect, once hardware safety characterization is defined in accordance with the hardware FMEDA analysis described above in phase 202, a mapping between the hardware components and the software components is then performed in phase 204. That is, a safety analysis of the software stack is performed, and an evaluation is conducted with respect to the contribution due to any application-oriented software diagnostics (e.g. comparison by software in the example use case). To do so, aspects include a consideration of the software components of the target system and how the software components are related with respect to the particular safety application.

For example, a typical software safety architecture in which a comparison by software is implemented (e.g. the example use case discussed above with respect to FIG. 1) is based upon software redundant calculation on multi-core systems. Again, for such an analysis, equivalent (if not identical) copies of the same application are executed on different cores and results (e.g. outputs to system and safety critical variables) are compared.

However, the aspects described herein use a reference software stack to perform the functionality described herein with respect to phase 204. In other words, to perform the used in which two instances of a safety application (SA) are bound to execute on two different processing units together with a distributed service layer (including the OS, Middleware, drivers and other common SW components), other SW diagnostics like STL (SW test libraries), and potentially additional non-safety workloads. The main software elements for this example use case are better described below in Table 1.

TABLE 1

Figure 4:
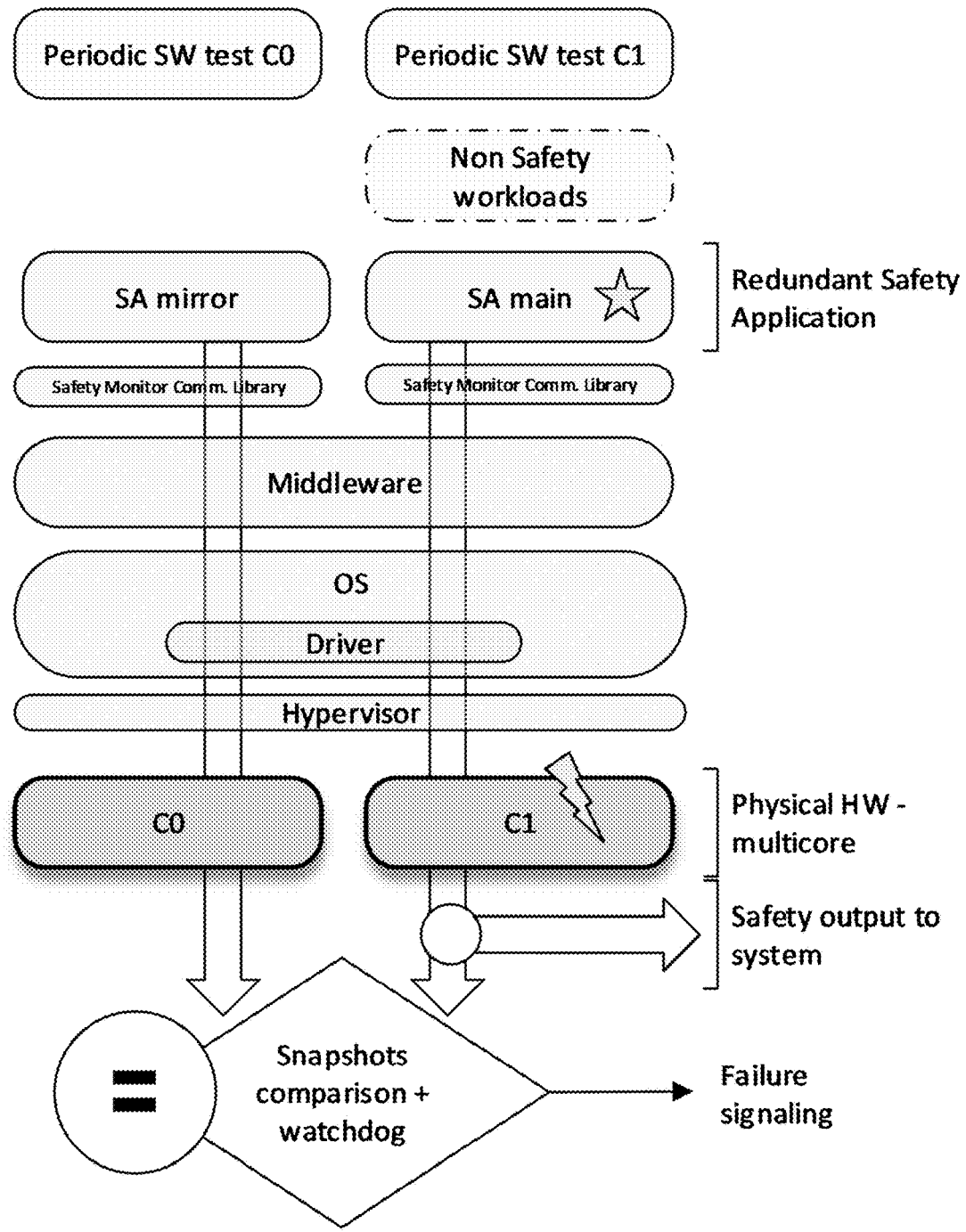
FIG. 4 illustrates an example of a software stack implementation in a single-SoC multiprocessing architecture, in accordance with one or more aspects of the present disclosure.

| Term/element | Description |
| --- | --- |
| Safety application(s) | Workloads classified as safety relevant by end user/system integrator. Generally, workloads implementing safety function(s)/elementary safety functions(s) are considered as safety relevant. |
| Safety Related Variable(s) | A set of finite variables and SW parameters that comprehensively represents the state of a safety workload. If "safety related variables"are compared between two channels executing same safety workload (in a lockstep manner), comparator shall detect channels failures resulting in discrepancies in the compared variables. For each safety workload end user/system integrator need to define the set of safety related variables. |
| Safety Monitor Communication | A software component that generates the snapshots when executed by a safety workload.<br>This library can be provided by device supplier (Intel) to system integrator. System integrator decides on the frequency of executing the library. The library should be executed by each WL at least once every DTI. |
| Snapshot | Snapshot is the packet that the safety monitor communication library sends to safety monitor device, representing the status of the safety application SW/safety workload (e.g. status of safety related variables). It is computed on a set of safety relevant variables/data. In addition, the snapshot also contains identification information such as core ID, workload ID and snapshot sequence number. |
| Safety Monitor | Element that implements the SW snapshot comparator and the watchdog. It includes the fault detection logic and initiates safe state signals to the system on event of failure.<br>The Safety monitor can be either an Intel ® Safety Island or an internal or external MCU/FPGA. |
| SW tests | Periodic SW tests executed to diagnose the HW functionality. |
| Service SW elements | SW elements that are used to provide the safety application with the required set of SW capabilities and support. Include the OS, hypervisor, BIOS, drivers, and other. |
| Non-safety workloads | Other SW elements that are not relevant for the safety application (implementing functions that are not relevant to safety critical operations or supporting them). Those items are only relevant for what concerns the capability of interfering with safety critical operations. | failure rates allocation from hardware to software components and perform an analysis of the software components and their potential failures, the software stack is first defined. In this example, the software stack is defined in accordance with the example use case, although this is by way of example and not limitation, and the software stack may be defined in accordance with any suitable manner based upon the particular type of test that is performed. An example of this process is shown in FIG. 4, which illustrates an example of a software stack implementation in a single-SoC multi-processing architecture in which SW cross-comparison is performed. This is by way of example and not limitation, and the aspects described herein may be implemented in accordance with any suitable number and/or type of circuit architecture, number of processors and/or cores, etc. In the example shown in FIG. 4, a single-SoC implementation is In an aspect, the software stack analysis facilitates an understanding of how failures of the different hardware components (i.e. not detected by diagnostics identified in the hardware FMEDA of phase 202) can affect the software (i.e. which software components are impacted). Moreover, the software stack analysis enables an evaluation of how the different hardware components impact the effect of a failure to the safety function, and what in turn may be claimed with respect to random failures affecting the hardware. For example, the software stack analysis at phase 204 may enable a determination of which underlying hardware random faults lead to a common cause fault that is causing undetected and/or dangerous failures.

In an aspect, prior to analyzing the effect of hardware failures to software components, and to build a quantitative analysis, failure rates calculated with the hardware FMEDA analysis in phase 202 are allocated to the different software components based upon a set of principles. Specifically, if a software component makes use of a certain hardware resource during its execution on the device, it can be presumed that if there is a failure in the hardware portion belonging to such a resource, and then the software component might be affected and also fail. The hardware resource in this context may be, for instance, a dedicated hardware resource such as a specific I/O interface for a communication driver, or a shared hardware resource such as a cache memory or an instruction decoder of a processing element.

Aspects include applying these principles in conjunction with knowledge of the failure modes distribution associated with the hardware elements and mapping the effect of the hardware faults to software components and their failure modes. In doing so, phase 204 facilitates the generation of a quantitative relationship between hardware and software failure modes. Thus, a quantitative measure of software failures caused by the residual hardware failures (e.g. $\lambda DU\_noApp$ as discussed with reference to FIG. 1) can be obtained. In other words, a subset of the software components associated with the safety-based application that are affected by the hardware components associated with the set of undetected hardware failures are allocated to those hardware components. For instance, and turning now to FIG. 5, an example of a mapping or allocation of the failures that are undetected after the hardware FMEDA analysis ($\lambda DU\_noApp$) performed in phase 202, is shown in further detail. That is, FIG. 5 shows an example of hardware element undetected failure rates and their corresponding allocation to various software components among various software classes.

In various aspects, the mapping in phase 202 may be performed starting from the $\lambda DU\_noApp$ failure rates of identified hardware parts/subparts, at a finer level, or at any suitable granularity. For example, this process may include mapping or allocating down to the level of each individual failure mode. The mapping or allocating may be performed by considering whether the failure mode can potentially cause a specific software element to fail or not to fail. This determination can be performed, for example, by a device supplier, who has a sufficient knowledge of the hardware without knowledge of the details of the software components that an integrator will include in a specific design. The device supplier can, for example, define any suitable number of predetermined classes of equivalent (for the sake of making the above determination) software components that would presumably be affected by hardware failures in a similar way.

With continued reference to FIG. 5, aspects include the distribution of each hardware failure rate being determined for each line among the affected (i.e. subset of) software components. In accordance with various aspects, different approaches may be implemented to determine a partitioning criteria to facilitate these distribution calculations. For example, the distribution of hardware failure rates to the software components may be permanent or transient. In accordance with aspects in which a permanent failure rate distribution is determined, the hardware permanent fault residual failure rate (Fperm) is equally partitioned with respect to the different software failures that are affected (i.e. a flat distribution). An example of this type of permanent failure rate partitioning or distribution is shown in FIG. 6A, which illustrates an equal partitioning of the hardware failure rate on the various running softwares. That is, the example shown in FIG. 6A illustrates an equal allocation of the affected (i.e. subset of) software components with respect to a contribution of each one as affected by a failure of one or more hardware components.

With respect to approaches for determining permanent failure rate distributions, another example is shown in FIG. 6B, and constitutes a more "conservative" approach to the equal partitioning or distribution of hardware permanent residual failure rate shown in FIG. 6A. The approach shown in FIG. 6B illustrates a full allocation of the hardware failure rate on the various running softwares. In other words, it is assumed that the sum of all failure rates of hardware elements that are allocated to a certain software component contribute fully to determine the failure rate of that software component. That is, the example shown in FIG. 6B illustrates a full allocation of the affected (i.e. subset of) software components with respect to a contribution of the sum of the subset of software components affected by a failure of one or more hardware components. In such a case, the software component failure rate is then computed in accordance with such aspects as the sum of all relevant hardware failure rates. This approach is considered more conservative than the equal partitioning of hardware permanent residual failure rate shown in FIG. 6A because, with this full allocation approach, the overall resulting sum of failure rates of all software component will be higher. In accordance with such aspects, this "overestimation" of failure rates may then be compensated by a different algorithm to evaluate the combined contribution of all the application-oriented software measures applied, which is described in further detail below with respect to phase 210.

In accordance with various established safety standards, failures can be due to permanent damage to a device (e.g. a portion thereof), as well as due to transitory effects such as interference, for instance. Therefore, both of these effects (and the associated probability of failures) should be taken into account to provide a safety analysis that meets such standards. Therefore, in some aspects, a transient failures probability distribution may also be determined, which may be performed in a similar manner with respect to the distribution of permanent failure rates. In accordance with such aspects, the hardware transient fault residual failure rate (Ftrans) may be partitioned to the software failures in consideration of an average time reserved by the CPU (or other suitable processor) with respect to the execution of the different software components. In other words, the transient partitioning aspects may utilize time-based partitioning versus the use of a permanent distribution of hardware failure rates.

Regardless of the type of partitioning that is implemented, aspects included the application of the specific distribution criteria to, for example, all general-purpose hardware resources in a processing unit that are expected to be utilized in a very similar way by every software component. The rationale in this case is that it is highly impractical and error prone to otherwise determine the effect of a localized hardware failure to software without a detailed understanding of the design of both the hardware and software components. This is due to both hardware complexity and the unpredictable nature of the effect of a failure, which vary depending on the individual occurrence. In other words, a hardware-oriented representation of the component, coming from allocation of hardware failure rates, is "horizontal" to a software representation of the system, as hardware elements are often shared by software components, especially in a processing unit.

Based upon this analysis, aspects include further applying the following rules as part of the analysis in phase 204 in accordance with the specific distribution or allocation of software compounds discussed above as follows:

First, a permanent fault in the hardware can potentially impact any software component that makes use of that hardware in a software loop, except when there is proper justification to claim differently. A uniform distribution of the failure rates assumes that all software components are affected by hardware failures with equal probability.

Second, a transient fault in the hardware likely affects the software component that is running at the time a bit-flip occurs or the first time the data is consumed. It can be assumed, when proper justification does not otherwise exist, that the probability of a software component to be subjected to a transient random fault is proportional to the average time required for the software components to execute.

As software performing safety critical operations often executes in a deterministic real-time loop, a system integrator may determine an allocation for transient hardware failures according to the average execution time of each task. In an aspect, and as further discussed below, the techniques discussed herein may be implemented as a tool (e.g. standalone device, software that is run on a computer, etc.) such as a software and hardware platform to facilitate customization to be performed by the system integrator based upon their specific software profile distribution.

Other examples of the hardware elements considered in addition to the individual processing units are the shared hardware memory elements and the multi-core interconnect fabric. As these are shared hardware resources, special considerations are needed to claim diagnostic coverage by means of the software application redundancy. Various examples of these special considerations that may be performed in phase 204 are provided below.

As a first example, memory cells associated with the multiple copies of the safety application should be well separated to benefit from the software redundancy, and additional common cause failures (CCF) countermeasures may be used if there is no physical separation of the relevant memory cells. If this condition of memory cell separation is satisfied, then the hardware failure rates associated with memory portions used by each instance of the redundant safety application can be allocated to respective software components. The failure rates corresponding to shared memory regions can alternatively follow the same distribution criteria described above.

As a second example, memory interfaces are typically shared between multiple copies of the safety application in the example use case, in which redundant processing is executed in a multi-processor device. Application-oriented diagnostic measures can still apply to provide diagnostic coverage so that failure rates allocation from hardware to software components can be applicable in this case as well, but only to cover the hardware failure modes that are not subject to potential CCF. For example, permanent failure rates of hardware portions potentially affected by CCF may be excluded in the analysis from the mapping to software components, and managed separately.

As a third example, the bus interconnect can benefit from the software redundancy in the case in which the comparison is performed or monitored by some external agent (e.g. external to the multi-core architecture). Alternatively, the bus interconnect can benefit if application-oriented end-to-end protection (data integrity checksum, packet identification codes, transfer timeout checks, etc.) is applied to the data transmission. Distribution of hardware failures to software components may thus be performed only for the failure modes that can have coverage from CCF. Other failure modes may be excluded if the application-oriented measure does not provide justifiable diagnostic coverage contribution.

Phase 206: Classification of the Software Components and Effect Analysis of Software Failure Modes Once the failure rates are allocated to the specific affected software components as described above in phase 204, aspects include accounting for the benefit of the specific software safety architecture and application-oriented safety measures to evaluate the DC. In an aspect, this is performed by means of an FMEDA analysis, but with respect to the previously-identified software components (i.e. the allocated subset of software components as noted above) as opposed to the hardware-based analysis performed in phase 202. As an example, aspects include performing an analysis of the potential failure modes and their effect on the safety application. Then, depending on the identified effect, the analysis will result in a classification of the failure modes with respect to the ability of the application-oriented safety measures to detect and report them to system, preventing the violation of the intended safety goal of the application.

Figure 7:
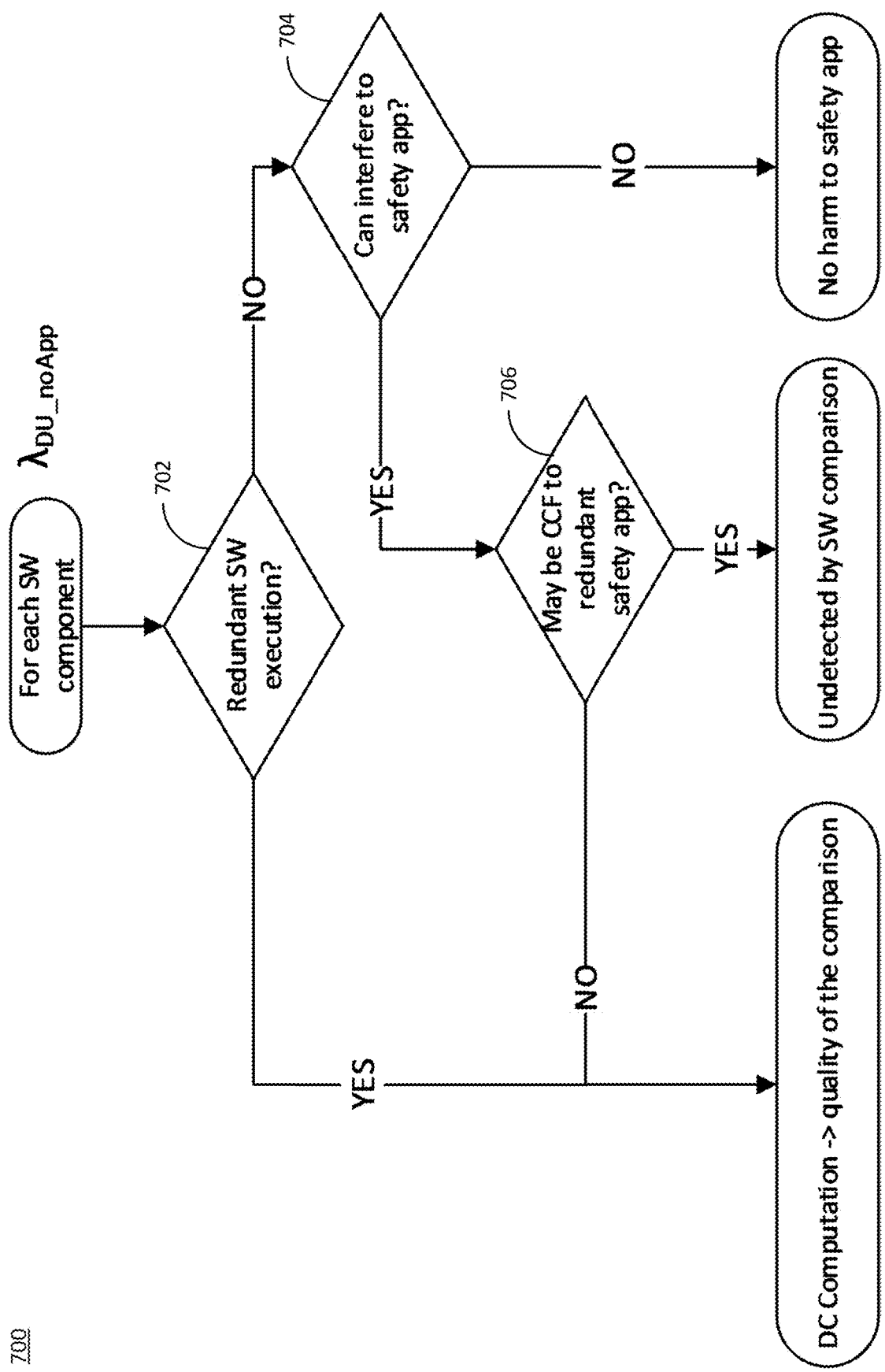
FIG. 7 is an example flow chart of analysis criteria for reciprocal comparison by software, in accordance with one or more aspects of the present disclosure.

In accordance with an aspect of the present disclosure, the following example considerations are to be made (with reference to the comparison by software use case example) as described below with reference to the flow chart shown in FIG. 7, which illustrates various predetermined software analysis criteria for reciprocal comparison by software that may be implemented as part of the software-based analysis in phase 206. Thus, the set of predetermined criteria as shown in FIG. 7 may represent software analysis criteria for the reciprocal cross comparison by software in accordance with the diagnosis via the example use case described above. These criteria are by way of example and not limitation, and the aspect described herein may use a set of predetermined criteria that is different than or includes additional or fewer criteria.

First, for each allocated software component (e.g. the aforementioned subset of software components), an evaluation is performed (block 702) to determine which software component failure modes are assigned to redundant execution.

Second, another evaluation is performed (block 704) to determine interference with the safety-based application. This may include the software component failure modes affecting both copies of the redundant safety application (common-cause failures or dependent failures according to IEC61508 definitions). For instance, interference may be due to shared software resources (block 704—YES) (i.e. software components that are directly supporting the safety application but not executed with redundancy), including both safety-related and non-safety related software components. This may additionally or alternatively include interference due to non-shared software resources (i.e. software components that are not directly connected to the safety application), which typically represents non-safety related software components.

Third, in cases in which interference is possible (block 704—YES), each failure mode (FM) is classified according to the capability of affecting the two copies of the redundant safety application in the same way so that the comparison by software is not capable of detecting the failure of the intended functionality (block 706). This may include, for instance, common-cause failures or dependent failures according to IEC61508 definitions. Failing of a shared software resource typically has significant potential to cause a dependent failure to the safety application. Thus, aspects include the evaluation of interference as the potential to cause the safety application (e.g. an interference target) to fail.

In an aspect, the software FMEDA analysis according to the predetermined set of criteria described above with reference to FIG. 7 may be performed by a design supplier, for example, based upon a definition of predefined software classes using any suitable type of classification scheme. These classes may be equivalent with respect to a predetermined classification of failures as previously introduced in phase 204 and further referenced with respect to FIG. 5. For the assumed example use case, the different software components can be classified using the following classes of software elements as an example as follows:

1. Redundant software, such as the safety application and SMC library as shown as discussed above with reference to FIG. 4, for example.

2. Shared software resources, such as the "OS" and "Middleware" as shown as discussed above with reference to FIG. 4, for example.

3. Non-Safety-Related Applications, such as the "Non-Safety workloads" as shown as discussed above with reference to FIG. 4, for example.

4. Other software diagnostics, such as the "Periodic SW test libraries" as shown as discussed above with reference to FIG. 4, for example.

In an aspect, each of the software components belonging to each respective class has the same potential to violate the goal of the customer safety function. Thus, failure modes can be defined that suits all software components for each class. This allows the device manufacturer to provide a pre-compiled software analysis that can be used by the system integrator without knowing the details of each software component. The system integrator thus only needs to assign the different software components from a particular use case to these defined classes.

Moreover, phase 206 includes performing the software FMEDA to determine the failure modes and associated probabilities (see example in Table 2) when evaluating the potential of a failure in one of the components belonging to each class to be detected using the comparison by software. Alternatively, the failure modes and associated probabilities may be evaluated with respect to the interference with a safety application such that erroneous outputs are generated by both instances of the failure. An example of the determined failure modes and associated probabilities is shown in further detail below with respect to Table 2, which illustrates examples of a software FMEDA analysis for the example use case (comparison by software) for redundantly executed software for a safety-based application.

TABLE 2

Redundant execution of SW component (Customer Safety App)

| FM_ID | Description of the HW FM impact on Redundant execution of SW components (Customer Safety App) | End Effect on the safety function | SW FMD % | Diagnostic coverage (DC) |
|---|---|---|---|---|
| Redu_SW_FM1 | HW failures not affecting the redundant SW execution | No effect to Safety App. | x.xx % | 0% |
| Redu_SW_FM2 | HW failures affecting redundant SW execution in such a way as to cause bad results sent to outputs | Redundant copies of Safety App produce different outputs. | x.xx % | Determined by «quality of the comparison» |
| Redu_SW_FM3 | HW failures affecting redundant SW execution in such a way as to cause correct outputs but interference to same or other SW components running on same core. | Redundant copies of Safety App produce different outputs. | x.xx % | Determined by «quality of the comparison» |
| Redu_SW_FM4 | HW failures affecting redundant SW execution in such a way as to cause bad results sent to outputs and interference to redundant copy running on other core | Safety App potentially affected | x.xx % | 0% |
| Redu_SW_FM5 | HW failures affecting redundant SW execution in such a way as to cause CPU core to stall, delay or alter the program flow. | Safety function stopped or delayed causing timeout | x.xx % | Up to 99.99% |

Table 2 shows each failure mode of software component (or class) described in a software FMEDA. Also shown are the effects on safety function determined for each failure mode (e.g. of Redu_SW_FM1). The effects are classified into detected or undetected depending on how the application-oriented safety measures can detect them. The DC for each detected failure mode is also shown and described.

In a first-order approximation, the aspects assume that the above FMEDA analysis is not dependent on the specific characteristics of each individual software component, so that it is not necessary to repeat the analysis for each specific implementation. Table 2 as shown above, as well as Tables 3, 4, and 5, shown below, are examples of the software FMEDA analysis being performed in phase 206. For example, Table 3 below illustrates examples of software FMEDA for the example use case (comparison by software) for common software resources.

TABLE 3

Execution of common SW resources (OS, Middleware)

| FM_ID | Description of the HW FM impact on Redundant execution of SW components (Customer Safety App) | End Effect on the safety function | SW FMD % | Diagnostic coverage (DC) |
|---|---|---|---|---|
| Comm_SW_FM1 | HW failures not affecting the common SW resources | No effect to Safety App. | x.xx % | 0% |
| Comm_SW_FM2 | HW failures affecting execution of common SW resource but not causing interference to safety app. | No effect to Safety App. | x.xx % | 0% |
| Comm_SW_FM3 | HW failures affecting execution of common SW resource in such a way as to cause bad results sent to outputs detectable by redundant scheme (Interference to Safety App) | Redundant copies of Safety App produce different outputs. | x.xx % | Determined by «quality of the comparison» |
| Comm_SW_FM4 | HW failures affecting execution of common SW resource in such a way as to cause interference potentially to multiple copies of redundant SW application (eventually bad results sent to outputs) | Safety App potentially affected | x.xx % | 0% (conservative) |
| Comm_SW_FM5 | HW failures affecting execution of common SW resource in such a way as to cause CPU core to stall, delay or alter the program flow. | Safety function stopped or delayed causing timeout | x.xx % | Up to 99.99% |

Moreover, Table 4 below shows examples of software FMEDA for the example use case (comparison by software) for software test libraries in redundant multi-processing.

TABLE 4

Execution of SW Test libraries in redundant multi-processing

| FM_ID | Description of the HW FM impact on Redundant execution of SW components (Customer Safety App) | End Effect on the safety function | SW FMD % | Diagnostic coverage (DC) |
|---|---|---|---|---|
| STL_SW_FM1 | HW failures affecting the STL execution, but detected and reported by STL | System moves to safe state as result of the detection | x.xx % | 0% |
| STL_SW_FM2 | HW failures not affecting the STL execution | No effect to Safety App. | x.xx % | 0% |
| STL_SW_FM3 | HW failures affecting STL execution in such a way it does not detect the fault but completes w/o failure | Redundant copies of Safety App produce different outputs. | x.xx % | Determined by «quality of the comparison» |
| STL_SW_FM4 | HW failures affecting STL execution in such a way it completes w/o failure but cause interference to other SW components running also on other cores | Safety App potentially affected | x.xx % | 0% (conservative) |
| STL_SW_FM5 | HW failures affecting STL execution in such a way it does not complete and causes CPU to stall or alter the program flow | Safety function stopped or delayed causing timeout | x.xx % | Up to 99.99% |

Still further, Table 5 below shows examples of software FMEDA for the example use case (comparison by software) for the execution of other customer non-safety applications.

TABLE 5

Execution of other customer non-safety application

| FM_ID | Description of the HW FM impact on Redundant execution of SW components (Customer Safety App) | End Effect on the safety function | SW FMD % | Diagnostic coverage (DC) |
|---|---|---|---|---|
| NSA_SW_FM1 | HW failures not affecting customer non-safety Application SW | No effect to Safety App. | x.xx % | 0% |

TABLE 5-continued

Execution of other customer non-safety application

| FM_ID | Description of the HW FM impact on Redundant execution of SW components (Customer Safety App) | End Effect on the safety function | SW FMD % | Diagnostic coverage (DC) |
|---|---|---|---|---|
| NSA_SW_FM2 | HW failures affecting non-safety Application SW execution in such a way as to cause wrong execution but not interfering to SW Safety App or other common resources | No effect to Safety App. | x.xx % | 0% |
| NSA_SW_FM3 | HW failures non-safety Application SW execution in such a way as to cause interference to SW Safety App or other common resources | Safety App potentially affected | x.xx % | 0% (conservative) |
| NSA_SW_FM4 | HW failures non-safety Application SW execution in such a way as to cause CPU core to stall, delay or alter the program flow. | Safety function stopped or delayed causing timeout | x.xx % | Up to 99.99% |
| NSA_SW_FM1 | HW failures not affecting customer non-safety Application SW | No effect to Safety App. | x.xx % | 0% |

Thus, aspects include assigning the distribution of each failure mode defined in the software FMEDA analysis in phase 206 using considerations of any suitable number of factors (e.g. all available factors) that can determine a potential occurrence of a failure. To determine the assignment of the distribution in this manner, aspects include utilizing information from the hardware design (e.g. input data), which may be particularly useful when this step is performed by a device manufacturer who has detailed knowledge of the hardware to do so. Alternatively, aspects include performing an estimate of the occurrence probability and using this estimate to determine the FM distribution. That is, occurrence may be assigned according to the FMEA methodology guidelines, additional details of which are provided in U.S. patent application publication number US2019/0235943. An example of the assignment of software failure modes occurrence in accordance with such methodology guidelines is shown in further detail below in Table 6.

TABLE 6

| Description | Definition | # |
|---|---|---|
| Very Frequent | Periodic task/operation (Likely to occur frequently (fortified)) | 10 |
| Frequent | Likely to occur frequently | 9 |
| Very Probable | Will occur several times in the usage of the SW (fortified) | 8 |
| Probable | Will occur several times in the usage of the SW | 7 |
| Moderate Occasional | Likely to occur sometime in the usage of the SW (fortified) | 6 |
| Occasional | Depends on control flow and external events (Likely to occur sometime in the usage of the SW) | 5 |
| Remote | Unlikely but possible to occur in the usage of the SW (fortified) | 4 |
| Very Remote | Unlikely but possible to occur in the usage of the SW | 3 |
| Improbable | So unlikely, it can be assumed occurrence may not be experienced (fortified) | 2 |
| Very Improbable | Runs only on start-up/boot (So unlikely, it can be assumed occurrence may not be experienced) | 1 |

As shown in Table 6 above, the assignment of software failure modes occurrence using software FMEA assigns a value ranging from 1 to 10, and an FM % may then be determined proportionally to that value, maintaining the sum of FM distribution for each individual software component equal to 100%. It is noted that the FM distribution for transient and permanent failures for one software component may differ in consideration of the different probability of occurrence of certain failures with respect to others. In general, however, permanent failures have a higher probability of causing livelocks/deadlocks with respect to transient failures, which more often cause erroneous data results.

Phase 208: Evaluation of the Quality of the Diagnostic

In an aspect, even if the safety standards define a typical diagnostic capability achievable by many diagnostic mechanisms, the values in the standards should be considered only as a reference, particularly if there are parameters that could influence the quality of the diagnostic and therefore reduce the claimed diagnostic coverage. In the example use case described herein, the main application-oriented measure used is a comparison by software of results obtained from two copies of the same application. In functional safety standards, the diagnostic coverage of software comparison is defined as "high" (theoretically up to 99%), depending on the quality of comparison (ref. ISO 26262-5:2018, Table D.4, and IEC 61508-2:2010, Table A.4).

However, no indication is provided to determine the effective quality of the comparison, which is reasonably determined by the manner in which the safety-based application is actually executed for a particular use case. This may include, for instance, the frequency of data comparison and amount of data compared, the efficiency of comparison, if data compression is used, etc. Moreover, the effective quality of comparison may be determined by the probability of failures with common effect to the two channels so that it cannot be revealed by means of this technique, which may be the result of, for example, the accumulation of failures in the two channels over data that are not compared, leading to identical faulty data generated for comparison.

Thus, a technique for the quantification of the quality of the comparison in a system based on application software redundancy and comparison by software based on a quantification of the dependent failures is described in U.S. patent application publication no. US2019/0050300, which may be implemented in accordance with the aspects described herein as part of phase 208 for this purpose.

Alternatively, and in accordance with the above consideration, a simplified DC estimation can be obtained using the following empirical formula represented in Equation 1 below, which accounts for the manner in which the safety-based application is actually executed for a particular use case:

$$DC_{comp} = \frac{D_{comp}}{D_{out}} \times \left(1 - \frac{V_{SR} - V_{comp}}{V_{SR}}\varepsilon\right) \times (1 - P_{ue\_sign}), \quad \text{Eqn. 1}$$

where $\frac{D_{comp}}{D_{out}}$ is the ratio of $D_{comp}$, which represents an amount of output data exposed for comparison and $D_{out}$, and which represents an amount of output data generated by the safety application to the system in a time period (e.g. every safety loop). Moreover, the term $(1-P_{ue\_sign})$ represents a probability of having a combination of errors that is undetected during signature comparison due to error masking in the calculations. In an aspect, this may be significantly reduced through the use of CRC32 such that this term can be generally neglected. For example, in accordance with the IEEE 802.3 CRC-32, the probability of having undetected errors $P_{ue\_sign}$ is bounded by $2^{-32}$ for any input bit error probability $0 < p \leq 0.5$.

Furthermore, the term $$\left(1 - \frac{V_{SR} - V_{comp}}{V_{SR}}\varepsilon\right)$$

is introduced to account for the potential effect of error accumulation over time in internal variables that are not exposed to the comparison. With respect to this term, $V_{SR}$ represents a total number of the Safety-Related variables (e.g. configuration parameters and/or intermediate results of the safety application), $V_{comp}$ represents a total number of safety variables exposed for comparison during each safety loop, and $\varepsilon$ is a parameter used to quantify the probability of occurrence of the same error (by two independent faults) in both copies of a variable during the time interval corresponding to a single comparison.

As an example, a conservative estimate may set $\varepsilon=0, 1$. As an illustrative example, taking the standards ISO 26262-5: 2018, Table D.4 as a reference example, and using $\varepsilon=0, 1$, then the high diagnostic coverage (99% or more) can be achieved when all safety-related variables are compared ($V_{SR}=V_{comp}$). Otherwise, "medium" diagnostic coverage (90%) is the maximum achievable when only outputs are compared. This also suits the examples from ISO 13849-1: 2006, Table E1.

The obtained DC quantity can thus be determined in the software FMEDA of previous step (phase 206) whenever comparison by software is an applicable mitigation to the failure mode.

Thus, phase 208 facilitates the calculation of an initial DC estimate $DC_{comp}$ using the allocated subset of software components from phase 204 and the software-based safety analysis performed in phase 206. This initial DC estimate may be considered an "ideal" or maximum case DC calculation based upon the quality of the diagnostic method used, and may be further reduced based upon the application of various mitigating factors, which is based upon the specific manner in which the safety-based application is executed for a particular circuit design and end use case to achieve an overall application-oriented DC calculation. That is, the ideal DC estimate may be provided by application-oriented safety measures associated with execution of the safety-based application. Thus, aspects include mitigating this ideal DC estimate in accordance with one or more mitigating factors as discussed further below in phase 210 to strike a balance between achieving an adequate DC calculation that still meets the required testing standards while avoiding an overly complex, unnecessary, and/or processor-intensive diagnostic.

Phase 210: Diagnostic Coverage Estimation Calculation

In an aspect, for each of the failure modes in which application-oriented safety measures can be claimed to detect the presence of a hardware malfunction (failures), a quantification of the ability of such software measures to detect a wrong output generation is then computed. In an aspect, this may be performed by determining an overall residual failure rate, after consideration of application-oriented measures, by computing a sum of each of the residual failure rates from the software FMEDA after the mitigations are applied. This may be performed, for example, in accordance with any suitable techniques, including known FMEDA techniques. Thus, the total or overall DC estimate calculation may be calculated based upon the ideal DC estimate (e.g. as shown and discussed with reference to Eqn. 1), the partial DC estimate (e.g. as discussed herein with reference to Eqn. 2), and the hardware dangerous failure rate. As discussed herein, the total or overall DC estimate may be calculated based upon the set of undetected hardware failures, the allocated subset of software components, and the manner in which the safety-based application is executed when modeled (i.e. analyzed, characterized, and/or diagnosed).

Figures 8A, 8B:
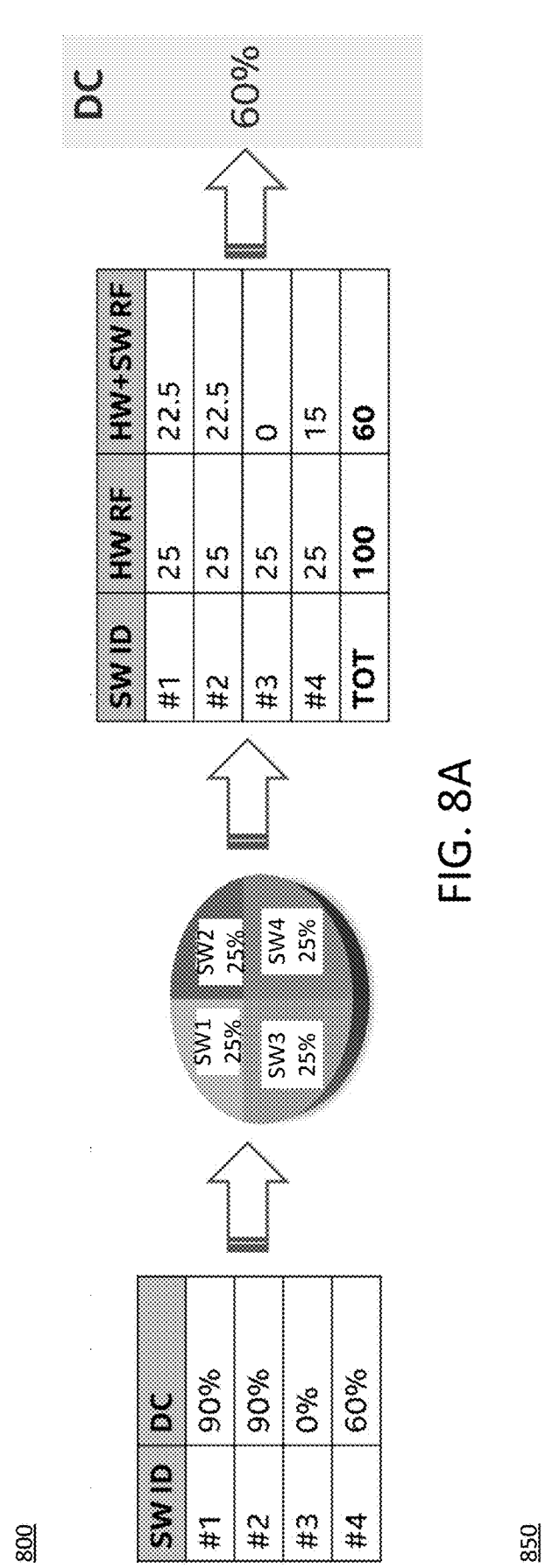
FIGS. 8A and 8B illustrate different approaches for determining DC allocation for hardware permanent fault residual failures, in accordance with one or more aspects of the present disclosure.

For instance, in an aspect the application-oriented DC estimate calculation accounts for the particular method used to distribute the hardware failure rates to software components. These methods may include, for example, the different options to determine the failure rates allocation from hardware to software components discussed above with respect to phase 204. Thus, when the distribution is already normalized as was the case for the equal partitioning of the hardware failure rates as shown in FIG. 6A, it is sufficient to compute the sum of residual failures from each of the individual failure modes, as shown in further detail in FIG. 8A. However, when a full allocation of the hardware failure rate is performed in phase 204 as shown in FIG. 6B, i.e. when the same hardware and residual hardware dangerous undetected failure rates are associated to different software components, it can be assumed that every software component can contribute to the detection on the relevant hardware. As a result, the DC can be set to a maximum DC value of the software components acting on that hardware as shown in FIG. 8B.

In an aspect, the diagnostic coverage provided by the application-oriented mitigations is then calculated as the total dangerous detected failures from software analysis ($\lambda DD\_App$) performed in phase 206 divided by the residual undetected failure rate from the hardware FMEDA analysis performed in phase 202, as represented in Equation 2 below as follows:

$$DC_{app} = \frac{\lambda_{DD\_App}}{\lambda_{DU\_noApp}}. \quad \text{Eqn. 2}$$

In this example, $DC_{app}$ represents an incremental DC due to application-oriented mitigations only. The term $\lambda_{DU\_noApp}$ represents the term $\lambda_{DU}$ as shown with reference to FIG. 3 (i.e. the undetected failures.

Moreover, the overall or total diagnostic coverage $DC_{Tot}$ provided by the combination of all available mitigations is then calculated against the total dangerous failure rate, as represented in Equation 3 below as follows:

$$DC_{Tot} = \frac{\lambda_D - \lambda_{DU\_App}}{\lambda_D}. \qquad \text{Eqn. 3}$$

That is, the total diagnostic coverage $DC_{Tot}$ represents the total DC due to the combined mitigations, including both hardware mitigations and application-oriented mitigations. The term $\lambda_D$ in this example represents the same term as shown and discussed herein with reference to FIG. 3. Again, in the example discussed in further detail below and used for the example of the phases in FIG. 2 as discussed above, the diagnosis is performed by a redundant execution of the safety-based application on the circuit design using reciprocal cross comparison by software.

Thus, Equations 2 and 3 define different calculated quantities $DC_{app}$ and $DC_{Tot}$. The first quantity, $DC_{app}$, is defined by Equation 2 and may be considered a partial DC calculation, as this only takes into account the software-based diagnostics. As discussed herein and shown in further detail in Eqn. 2 and the illustrative example provided below, the partial DC estimate may be based upon a weighted sum of individual contributions of each one of the allocated subset of software components to each one of the set of undetected hardware failures. Again, the terms used in each of Equations 2 and 3 above are derived from a sum of the software elements as discussed herein, which may be weighted based upon their individual contributions and/or the manner in which the software elements (e.g. the allocated subset of software components) are allocated to specific types of hardware failures. Thus, the second quantity, $DC_{Tot}$, represents the final (e.g. overall or total) DC estimate calculation. The final DC estimate calculation is therefore based upon the ideal DC estimate, the partial DC estimate, and the hardware dangerous failure rate and is appropriately mitigated based upon the weighted sum of all the individual contributions from partitioned elements, considering each of the different diagnostics involved. An illustrative example of this process is further discussed below with reference to an example dual-core processor circuit as shown in FIG. 9.

Figure 9:
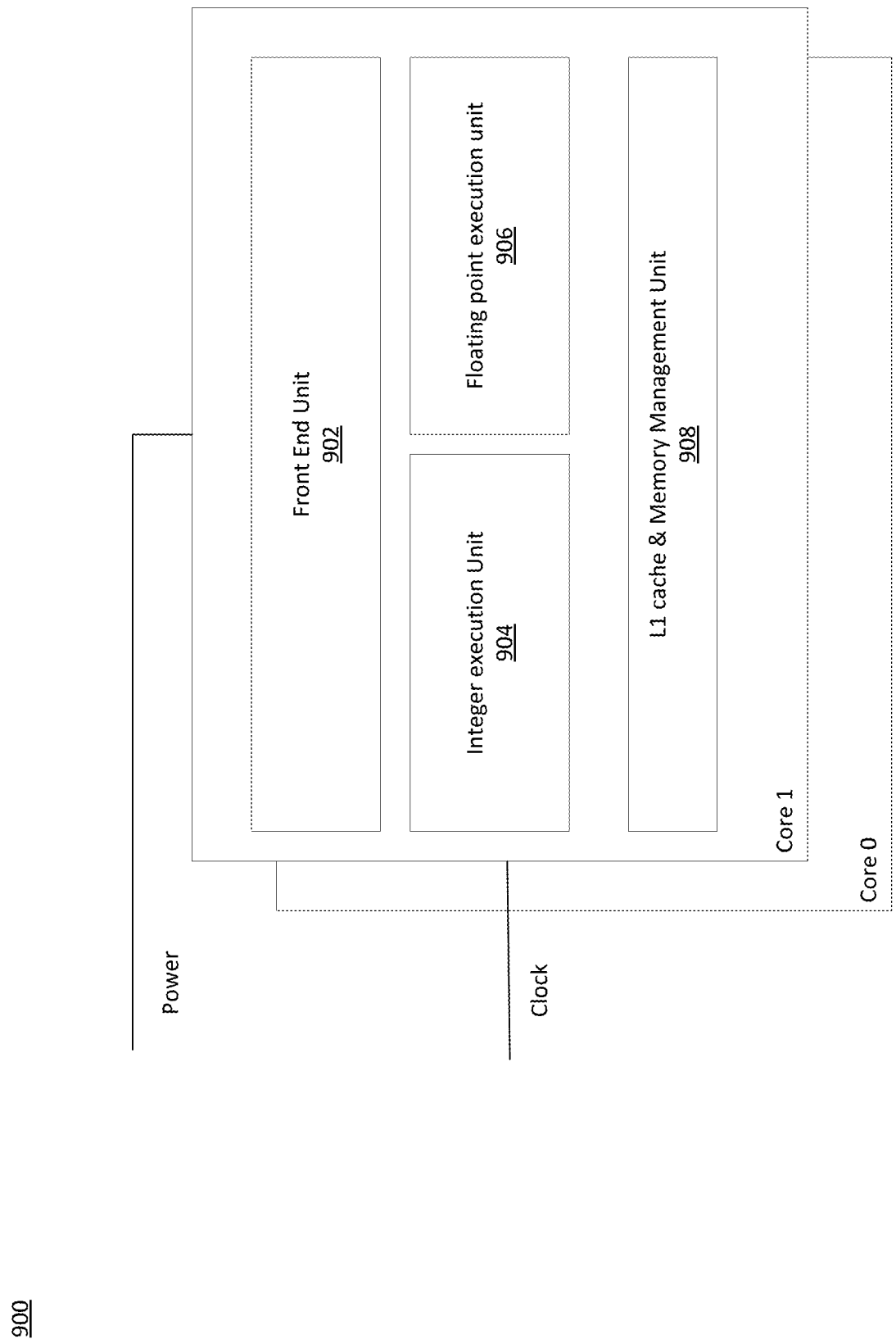
FIG. 9 illustrates a block diagram of an example dual core processor that is subjected to a quantitative analysis and diagnostic coverage (DC) calculation, in accordance with one or more aspects of the present disclosure.

Illustrative Example of DC Calculation for Software Redundancy and Dynamic Comparison in a Dual Core System FIG. 9 illustrates a block diagram of an example dual core processor that is subjected to a quantitative analysis and diagnostic coverage (DC) calculation, in accordance with one or more aspects of the present disclosure. As shown in FIG. 9, the dual core processor 900 includes two cores labeled Core 0 and Core 1. In an aspect, the dual core processor 900 is configured to execute a safety workload redundant calculation with "on Demand cross comparison" (ODCC) of results, and to compare signatures obtained by a predefined set of variables from the safety workload. The ODCC includes timing checks to ensure that the signatures are flowing as expected.

For purposes of brevity, only the details of the Core 1 are shown in FIG. 9, although each core may have identical or substantially similar components of operation. With reference to FIG. 9, each of the core 0 and Core 1 may include a front end unit 902 configured to perform an instruction fetch and to decode logic. To do so, the front end unit 902 may include, for instance, an instruction cache with parity protection, decode units, and a branch prediction unit to convert a thread into micro-level operational codes.

Each of the cores may also include an integer execution unit 904, a floating point execution unit 906, and a level 1 (L1) cache and memory management unit 908. The L1 cache may be configured with parity+retry or ECC, and may function to store operands. The memory management unit is configured for interacting with rest of the SOC associated with the dual core processor 900 and within the cores (Core 0 and Core 1 in this example).

Aspects include applying the various phases shown and discussed with reference to FIG. 2 to the dual core processor 900, as further discussed below as an illustrative example. To do so, the following example is provided operating in accordance with the following assumptions:

1. FMD % is a rough estimation of the Failure Mode Distribution for the blocks above in accordance with a dual-core processor SoC.

2. ECC or Parity+retry has an associated 99% diagnostic coverage.

3. For simplicity, a 100 FIT base failure rate is considered per core including permanent and transients.

4. The allocation from hardware to software is done considering equally partitioning the hardware fault residual failure rate ($\lambda$DU_NoApp) to the different software failures affected (flat distribution).

Application of Phase 202:

FIG. 10 provides an example failure mode analysis of the Core 1. As shown in FIG. 10, in order to move from a hardware-oriented description of the failure modes to a more software-friendly description, the final effect is considered to define new failure modes and distribution. FIG. 11 illustrates the distribution of the above failure mode on each end effect. By distributing the $\lambda$DU_NoApp as shown in FIG. 10 on the end effect as shown in the Table of FIG. 11, a residual fit of each end effect is determined as shown in the Table presented in FIG. 12.

Application of Phase 204:

As a flat distribution is considered in this example (i.e. the failure rates are equally partitioned to the software components), the Table in FIG. 13 illustrates hardware failure mode undetected failure rates allocation to the software components in accordance with this technique. With reference to FIG. 13, the data provided facilitates the calculation of $\lambda$D_App of each software component as a sum of products.

Application of Phase 206:

For the analysis of software components, the following classes of software elements are considered in this example:

1. Redundant safety application with ODCC;
2. Common software resources; and
3. Diagnostic software (STL).

Simplifying, it is assumed that the following software failure modes common to all classes:

1. It is assumed that only safety-relevant software is executed, then the "Non-Safety-Related Application" class of software elements is not evaluated in this example.

2. For purposes of brevity and ease of explanation, this example also assumes the following set of software failure modes common to all classes. However, it is noted that, generally, more detailed failure modes are determined in this phase as described above with reference to the Tables 2, 3, 4, and 5.

1. SW_FM1—No effect or delay (less than PST) to SW element;
2. SW_FM2—Failure cases redundant copies of Safety App produce different outputs;
3. SW_FM3—Failure cases copies of Safety App produce incorrect identical outputs;
4. SW_FM4—Failure cases stall of significant delay in one or both copies of the safety application.

In accordance with an aspect, the software FMEDA is performed in accordance with the Table as shown in FIG. 14. In order to evaluate the distribution of each failure mode (FMD) defined in the software FMEDA, the present example assumes that knowledge of the individual hardware failure modes is used (e.g. knowledge that typically comes from an understanding of the hardware design). In this case, different hardware failure modes are associated with FMD of software failures in software FMEDA, which are not the same.

Application of Phase 208:

In an aspect, an evaluation of the quality of the diagnostic for the applicable diagnostics is the calculated. For the ODCC comparison, the DC is computed evaluating the applicable parameters from the Table as shown in FIG. 15. By applying Eqn. 1 from above using the parameters as shown in the Table of FIG. 15, the diagnostic coverage of the ODCC will be as follows:

$$DC_{ODCC}=99\%$$

For the ODCC timeout monitors, the DC is computed assuming the following:

$$DC_{ODCC\_Timeout}=99\%.$$

In this example, $D_{ODCC}$ is considered the ideal or maximum DC estimate, as discussed above with respect to phase 208. In other words, the $D_{ODCC}$ is ideal in the sense that ODCC provides this DC contribution with limitations to the functionality (portion of the SW application) that is being compared.

Application of Phase 210:

By combining all the information from the previous tables as shown in FIGS. 10-15, the calculation of overall DC may be performed as follows:

$$\lambda_{DU\_noApp}=\Sigma_{(EE1,EE2,EE3)}\lambda_{DU\_noApp\_EE}=50.5 \text{ FIT}$$

$$\lambda_{DD\_App}=\Sigma_{(EE1,EE2,EE3)}\lambda_{DU\_noApp\_EE}$$
$$(FMD_{EE\_SW\_FM2}DC_{ODCC+}$$
$$FMD_{EE\_SW\_FM4}DC_{ODCC\_Timeout})=33.66 \text{ FIT}$$

Then, in accordance with Eqn. 2 above, the following calculations may be performed:

$$DC_{app} = \frac{\lambda_{DD\_App}}{\lambda_{DU\_noApp}} = 66.7\%$$

And the overall DC from combined hardware diagnostics and ODCC is obtained by:

$$DC_{Tot} = \frac{\lambda_D - \lambda_{DU\_App}}{\lambda_D} = 83.0\%$$

Figure 16:
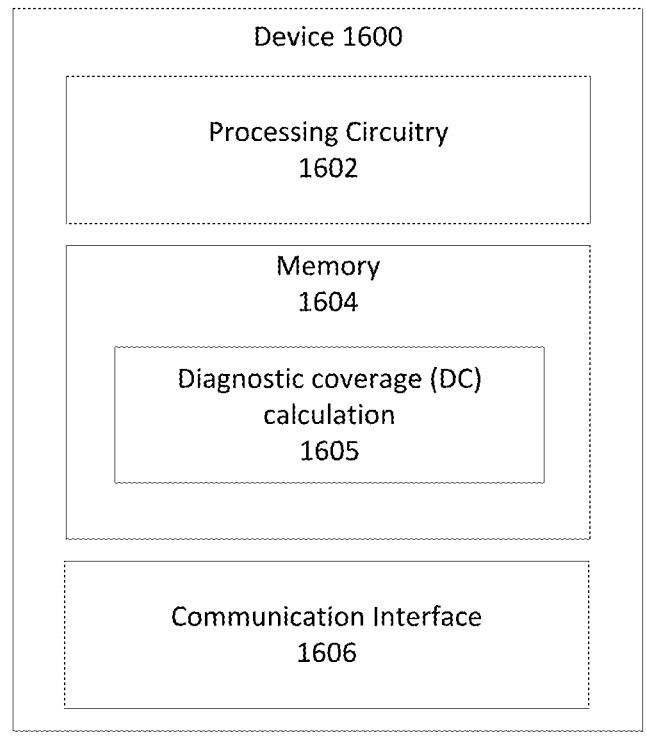
FIG. 16 illustrates an example device, in accordance with various aspects of the present disclosure.

FIG. 16 illustrates an example device, in accordance with various aspects of the present disclosure. In various aspects, the device 1600 may be implemented as any suitable type of device configured to receive, process, and calculate an application-oriented DC estimate for a particular circuit design using input data, as discussed with respect to FIG. 2 and throughout the disclosure. For example, the device 1600 may be implemented as a computer configured to receive input data and monitor an executed diagnostic test for a safety-based application. Alternatively, the device 1600 may be configured to analyze (e.g. model or characterize) a set of diagnostics for the safety application as discussed herein, and to calculate the DC using a modeling application or tool based on the described concepts. This modeling application or tool may form part of the software executed on the device 1600 to perform the functionality as discussed herein, or reside in a different device (not shown).

Thus, the example flow 200 as shown in FIG. 2, and the accompanying phases 202, 204, 206, 208, and 210, may represent a number of functions associated with respective blocks. The functionality associated with each of these blocks may be executed via the device 1600, which may be identified with an external agent or tool that calculates a DC estimate associated with the execution of a safety-based application as discussed above. This may include, for example, the use of the reciprocal-cross comparison to monitor data received when the safety-based application is executed in a redundant fashion, as disused herein with reference to FIGS. 1 and 4.

To do so, the device 1600 may include processing circuitry 1602, a memory 1604, and a communication interface 1606, which may be coupled to one or more wired and/or wireless connections that are not shown in FIG. 16 for purposes of brevity. The communication interface 1606 may facilitate the receipt of input data (e.g. a netlist or data associated with a particular circuit design) and optionally the transmission of data such as the calculated application-oriented DC estimation to a suitable device or display in accordance with any suitable communication interfaces and/or protocols. The components shown in FIG. 16 are provided for ease of explanation, and aspects include the device 1600 including additional, less, or alternative components as those shown in FIG. 16. For example, the device 1600 may include one or more power sources, display interfaces, peripheral devices, ports, etc. To provide additional examples, the device 1600 may include additional communication interfaces, and may be configured to transmit and receive data wirelessly or via one or more wired connections in accordance with one or more of such communication interfaces, which are not shown in FIG. 16 for purposes of brevity.

In an aspect, the various components of the device 1600 may be identified with functionality further described herein. To do so, processing circuitry 1602 may be configured as any suitable number and/or type of computer processors, which may facilitate control of the device 1600 as discussed herein. In some aspects, processing circuitry 1602 may be identified with one or more portions of a suitable computing device as noted herein. Aspects include the processing circuitry 1602 being configured to carry out instructions to perform arithmetical, logical, and/or input/output (I/O) operations, and/or to otherwise perform the aspects described herein and/or control the operation of one or more components of the device 1602.

For example, the processing circuitry 1602 can include one or more microprocessors, memory registers, buffers, clocks, etc., and may include, implement, or control portions of the device 1600, and/or components associated with other devices (e.g., within a computer network architecture). Such communications and/or control may be realized, for instance, in conjunction with the communication interface 1606. Moreover, aspects include processing circuitry 1602 communicating with and/or controlling functions associated with the memory 1604 and/or the communication interface 1606.

In an aspect, the memory 1604 stores data and/or instructions such that, when the instructions are executed by the processing circuitry 1602, causes the processing circuitry 1602 and/or the device 1600 to perform the various functions described herein in accordance with the flow 200 and phases associated therewith, for instance, as discussed herein with respect to FIG. 2. The memory 1604 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 1604 can be non-removable, removable, or a combination of both.

For example, the memory 1604 may be implemented as a non-transitory computer readable medium storing one or more executable instructions such as, for example, logic, algorithms, code, etc. The instructions, logic, code, etc., stored in the memory 1604 is represented by the DC calculation module 1605, and may include additional or alternate software components and/or instructions. The instructions stored in the DC calculation module 1605 may enable the aspects disclosed herein to be functionally realized. Alternatively, if the aspects described herein are implemented via hardware, the DC calculation module 1605 may include instructions and/or code to facilitate control, and/or monitor the operation of such hardware components.

In other words, the DC calculation module 1605 is provided for ease of explanation regarding the functional association between hardware and software components. Thus, aspects include the processing circuitry 1602 executing the instructions stored in the DC calculation module 1605 in conjunction with one or more hardware and/or software components to perform the various functions associated with the aspects as further discussed herein. In an aspect, the DC calculation module 1605 may store instructions that facilitates the execution of the phases 202, 204, 206, 208, and 210 as discussed herein respect to the flow 200 of FIG. 2, for example, via the processing circuitry 1602.

EXAMPLES

The following examples pertain to further aspects.

Example 1 is a device, comprising: a communication interface configured to receive input data corresponding to a circuit; and processor circuitry configured to analyze an executed safety-based application associated with the circuit, the safety-based application using one or more software components and one or more hardware components, the analysis including: performing, using the input data, a hardware-based safety analysis of the one or more hardware components used in accordance with the execution of the safety application to determine, for a predefined set of failure modes, a set of undetected hardware failures associated with a hardware dangerous failure rate; allocating, from among the one or more software components, a subset of software components that are affected by the one or more hardware components associated with the set of undetected hardware failures; performing, using the allocated subset of software components, a software-based safety analysis in accordance with a predefined set of criteria and a predefined classification of the one or more software components to calculate an ideal diagnostic coverage (DC) estimate provided by application-oriented safety measures associated with execution of the safety-based application; calculating a partial DC estimate based upon a weighted sum of individual contributions of each one of the allocated subset of software components to each one of the set of undetected hardware failures; and calculating a total DC estimate based upon the ideal DC estimate, the partial DC estimate, and the hardware dangerous failure rate.

In Example 2, the subject matter of Example 1, wherein the processor circuitry is further configured to analyze the safety-based application based upon a redundant execution of the safety-based application on the circuit using reciprocal cross comparison by software, and wherein the predefined set of criteria includes software analysis criteria for the reciprocal cross comparison by software.

In Example 3, the subject matter of one or more of Examples 1-2, wherein the processor circuitry is further configured to perform the hardware-based safety analysis in accordance with a failure modes, effects, and diagnostic analysis (FMEDA).

In Example 4, the subject matter of one or more of Examples 1-3, wherein the processor circuitry is further configured to perform the software-based safety analysis in accordance with a failure modes, effects, and diagnostic analysis (FMEDA) with respect to the subset of software components that are affected by the one or more hardware components associated with the set of undetected hardware failures.

In Example 5, the subject matter of one or more of Examples 1-4, wherein the predefined classification of the one or more software components includes a classification of the one of more software components into classes including redundant software, shared software resources, non-safety-related applications, and software diagnostics.

In Example 6, the subject matter of one or more of Examples 1-5, wherein the processor circuitry is further configured to equally allocate the subset of software components with respect to a contribution of each one of the subset of software components affected by a failure of the one or more hardware components.

In Example 7, the subject matter of one or more of Examples 1-6, wherein the processor circuitry is further configured to fully allocate the subset of software components with respect to a contribution of a sum of the subset of software components affected by a failure of the one or more hardware components.

In Example 8, the subject matter of one or more of Examples 1-7, wherein the processor circuitry is further configured to perform a time-based allocation of the subset of software components with respect to an average time used for execution.

Example 9 is a device, comprising: a memory configured to store computer-readable instructions; and one or more processors configured to execute the computer-readable instructions stored in the memory to: receive input data corresponding to a circuit; and analyze an executed safety-based application associated with the circuit, the safety-based application using one or more software components and one or more hardware components, the analysis including: performing, using the input data, a hardware-based safety analysis of the one or more hardware components used in accordance with the execution of the safety application to determine, for a predefined set of failure modes, a set of undetected hardware failures associated with a hardware dangerous failure rate; allocating, from among the one or more software components, a subset of software components that are affected by the one or more hardware components associated with the set of undetected hardware failures; performing, using the allocated subset of software components, a software-based safety analysis in accordance with a predefined set of criteria and a predefined classification of the one or more software components to calculate an ideal diagnostic coverage (DC) estimate provided by application-oriented safety measures associated with execution of the safety-based application; calculating a partial DC estimate based upon a weighted sum of individual contributions of each one of the allocated subset of software components to each one of the set of undetected hardware failures; and calculating a total DC estimate based upon the ideal DC estimate, the partial DC estimate, and the hardware dangerous failure rate.

In Example 10, the subject matter of Example 9, wherein the one or more processors are further configured to analyze the safety-based application based upon a redundant execution of the safety-based application on the circuit using reciprocal cross comparison by software, and wherein the predefined set of criteria includes software analysis criteria for the reciprocal cross comparison by software.

In Example 11, the subject matter of one or more of Examples 9-10, wherein the one or more processors are configured to perform the hardware-based safety analysis in accordance with a failure modes, effects, and diagnostic analysis (FMEDA).

In Example 12, the subject matter of one or more of Examples 9-11, wherein the one or more processors are further configured to perform the software-based safety analysis in accordance with a failure modes, effects, and diagnostic analysis (FMEDA) with respect to the subset of software components that are affected by the one or more hardware components associated with the set of undetected hardware failures.

In Example 13, the subject matter of one or more of Examples 9-12, wherein the predefined classification of the one or more software components includes a classification of the one of more software components into classes including redundant software, shared software resources, non-safety-related applications, and software diagnostics.

In Example 14, the subject matter of one or more of Examples 9-13, wherein the one or more processors are further configured to equally allocate the subset of software components with respect to a contribution of each one of the subset of software components affected by a failure of the one or more hardware components.

In Example 15, the subject matter of one or more of Examples 9-14, wherein the one or more processors are further configured to fully allocate the subset of software components with respect to a contribution of a sum of the subset of software components affected by a failure of the one or more hardware components.

In Example 16, the subject matter of one or more of Examples 9-15, wherein the one or more processors are further configured to perform a time-based allocation of the subset of software components with respect to an average time used for execution.

Example 17 is a non-transitory computer readable medium having instructions stored thereon that, when executed by one or more processors, cause the device to: receive input data corresponding to a circuit; and analyze an executed safety-based application associated with the circuit, the safety-based application using one or more software components and one or more hardware components, the analysis including: performing, using the input data, a hardware-based safety analysis of the one or more hardware components used in accordance with the execution of the safety application to determine, for a predefined set of failure modes, a set of undetected hardware failures; allocating, from among the one or more software components, a subset of software components that are affected by the one or more hardware components associated with the set of undetected hardware failures; performing, using the allocated subset of software components, a software-based safety analysis in accordance with a predefined set of criteria and a predefined classification of the one or more software components to calculate an ideal diagnostic coverage (DC) estimate provided by application-oriented safety measures associated with execution of the safety-based application; calculating a partial DC estimate based upon a weighted sum of individual contributions of each one of the allocated subset of software components to each one of the set of undetected hardware failures; and calculating a total DC estimate based upon the ideal DC estimate, the partial DC estimate, and the hardware dangerous failure rate.

In Example 18, the subject matter of Example 17, further including instructions that, when executed by the one or more processors, cause the device to analyze the safety-based application based upon a redundant execution of the safety-based application on the circuit using reciprocal cross comparison by software, and wherein the predefined set of criteria includes software analysis criteria for the reciprocal cross comparison by software.

In Example 19, the subject matter of one or more of Examples 17-18, further including instructions that, when executed by the one or more processors, cause the device to perform the hardware-based safety analysis in accordance with a failure modes, effects, and diagnostic analysis (FMEDA).

In Example 20, the subject matter of one or more of Examples 17-19, further including instructions that, when executed by the one or more processors, cause the device to perform the software-based safety analysis in accordance with a failure modes, effects, and diagnostic analysis (FMEDA) with respect to the subset of software components that are affected by the one or more hardware components associated with the set of undetected hardware failures.

In Example 21, the subject matter of one or more of Examples 17-20, wherein the predefined classification of the one or more software components includes a classification of the one of more software components into classes including redundant software, shared software resources, non-safety-related applications, and software diagnostics.

In Example 22, the subject matter of one or more of Examples 17-21, further including instructions that, when executed by the one or more processors, cause the device to equally allocate the subset of software components with respect to a contribution of each one of the subset of software components affected by a failure of the one or more hardware components.

In Example 23, the subject matter of one or more of Examples 17-22, further including instructions that, when executed by the one or more processors, cause the device to fully allocate the subset of software components with respect to a contribution of a sum of the subset of software components affected by a failure of the one or more hardware components.

In Example 24, the subject matter of one or more of Examples 17-23, further including instructions that, when executed by the one or more processors, cause the device to perform a time-based allocation of the subset of software components with respect to an average time used for execution via the subset of software components.

Example 25 is a device, comprising: a communication means for receiving input data corresponding to a circuit;

and processor means for analyzing an executed safety-based application associated with the circuit, the safety-based application using one or more software components and one or more hardware components, the analysis including: performing, using the input data, a hardware-based safety analysis of the one or more hardware components used in accordance with the execution of the safety application to determine, for a predefined set of failure modes, a set of undetected hardware failures associated with a hardware dangerous failure rate; allocating, from among the one or more software components, a subset of software components that are affected by the one or more hardware components associated with the set of undetected hardware failures; performing, using the allocated subset of software components, a software-based safety analysis in accordance with a predefined set of criteria and a predefined classification of the one or more software components to calculate an ideal diagnostic coverage (DC) estimate provided by application-oriented safety measures associated with execution of the safety-based application; calculating a partial DC estimate based upon a weighted sum of individual contributions of each one of the allocated subset of software components to each one of the set of undetected hardware failures; and calculating a total DC estimate based upon the ideal DC estimate, the partial DC estimate, and the hardware dangerous failure rate.

In Example 26, the subject matter of Example 25, wherein the processor means further analyzes the safety-based application based upon a redundant execution of the safety-based application on the circuit using reciprocal cross comparison by software, and wherein the predefined set of criteria includes software analysis criteria for the reciprocal cross comparison by software.

In Example 27, the subject matter of one or more of Examples 25-26, wherein the processor means further performs the hardware-based safety analysis in accordance with a failure modes, effects, and diagnostic analysis (FMEDA).

In Example 28, the subject matter of one or more of Examples 25-27, wherein the processor means further performs the software-based safety analysis in accordance with a failure modes, effects, and diagnostic analysis (FMEDA) with respect to the subset of software components that are affected by the one or more hardware components associated with the set of undetected hardware failures.

In Example 29, the subject matter of one or more of Examples 25-28, wherein the predefined classification of the one or more software components includes a classification of the one of more software components into classes including redundant software, shared software resources, non-safety-related applications, and software diagnostics.

In Example 30, the subject matter of one or more of Examples 25-29, wherein the processor means further equally allocates the subset of software components with respect to a contribution of each one of the subset of software components affected by a failure of the one or more hardware components.

In Example 31, the subject matter of one or more of Examples 25-30, wherein the processor means further fully allocates the subset of software components with respect to a contribution of a sum of the subset of software components affected by a failure of the one or more hardware components.

In Example 32, the subject matter of one or more of Examples 25-31, wherein the processor means further performs a time-based allocation of the subset of software components with respect to an average time used for execution.

Example 33 is a device, comprising: a memory means for storing computer-readable instructions; and one or more processors means for executing the computer-readable instructions stored in the memory to: receive input data corresponding to a circuit; and analyze an executed safety-based application associated with the circuit, the safety-based application using one or more software components and one or more hardware components, the analysis including: performing, using the input data, a hardware-based safety analysis of the one or more hardware components used in accordance with the execution of the safety application to determine, for a predefined set of failure modes, a set of undetected hardware failures associated with a hardware dangerous failure rate; allocating, from among the one or more software components, a subset of software components that are affected by the one or more hardware components associated with the set of undetected hardware failures; performing, using the allocated subset of software components, a software-based safety analysis in accordance with a predefined set of criteria and a predefined classification of the one or more software components to calculate an ideal diagnostic coverage (DC) estimate provided by application-oriented safety measures associated with execution of the safety-based application; calculating a partial DC estimate based upon a weighted sum of individual contributions of each one of the allocated subset of software components to each one of the set of undetected hardware failures; and calculating a total DC estimate based upon the ideal DC estimate, the partial DC estimate, and the hardware dangerous failure rate.

In Example 34, the subject matter of Example 33, wherein the one or more processor means further analyze the safety-based application based upon a redundant execution of the safety-based application on the circuit using reciprocal cross comparison by software, and wherein the predefined set of criteria includes software analysis criteria for the reciprocal cross comparison by software.

In Example 35, the subject matter of one or more of Examples 33-34, wherein the one or more processors means further perform the hardware-based safety analysis in accordance with a failure modes, effects, and diagnostic analysis (FMEDA).

In Example 36, the subject matter of one or more of Examples 33-35, wherein the one or more processors means further perform the software-based safety analysis in accordance with a failure modes, effects, and diagnostic analysis (FMEDA) with respect to the subset of software components that are affected by the one or more hardware components associated with the set of undetected hardware failures.

In Example 37, the subject matter of one or more of Examples 33-36, wherein the predefined classification of the one or more software components includes a classification of the one of more software components into classes including redundant software, shared software resources, non-safety-related applications, and software diagnostics.

In Example 38, the subject matter of one or more of Examples 33-37, wherein the one or more processors are further configured to equally allocate the subset of software components with respect to a contribution of each one of the subset of software components affected by a failure of the one or more hardware components.

In Example 39, the subject matter of one or more of Examples 33-38, wherein the one or more processors means further fully allocate the subset of software components with respect to a contribution of a sum of the subset of software components affected by a failure of the one or more hardware components.

In Example 40, the subject matter of one or more of Examples 33-39, wherein the one or more processors further perform a time-based allocation of the subset of software components with respect to an average time used for execution.

Example 41 is a non-transitory computer readable medium having instructions stored thereon that, when executed by one or more processor means, cause the device to: receive input data corresponding to a circuit; and analyze an executed safety-based application associated with the circuit, the safety-based application using one or more software components and one or more hardware components, the analysis including: performing, using the input data, a hardware-based safety analysis of the one or more hardware components used in accordance with the execution of the safety application to determine, for a predefined set of failure modes, a set of undetected hardware failures; allocating, from among the one or more software components, a subset of software components that are affected by the one or more hardware components associated with the set of undetected hardware failures; performing, using the allocated subset of software components, a software-based safety analysis in accordance with a predefined set of criteria and a predefined classification of the one or more software components to calculate an ideal diagnostic coverage (DC) estimate provided by application-oriented safety measures associated with execution of the safety-based application; calculating a partial DC estimate based upon a weighted sum of individual contributions of each one of the allocated subset of software components to each one of the set of undetected hardware failures; and calculating a total DC estimate based upon the ideal DC estimate, the partial DC estimate, and the hardware dangerous failure rate.

In Example 42, the subject matter of Example 41, further including instructions that, when executed by the one or more processor means, cause the device to analyze the safety-based application based upon a redundant execution of the safety-based application on the circuit using reciprocal cross comparison by software, and wherein the predefined set of criteria includes software analysis criteria for the reciprocal cross comparison by software.

In Example 43, the subject matter of one or more of Examples 41-42, further including instructions that, when executed by the one or more processors, cause the device to perform the hardware-based safety analysis in accordance with a failure modes, effects, and diagnostic analysis (FMEDA).

In Example 44, the subject matter of one or more of Examples 41-43, further including instructions that, when executed by the one or more processor means, cause the device to perform the software-based safety analysis in accordance with a failure modes, effects, and diagnostic analysis (FMEDA) with respect to the subset of software components that are affected by the one or more hardware components associated with the set of undetected hardware failures.

In Example 45, the subject matter of one or more of Examples 41-44, wherein the predefined classification of the one or more software components includes a classification of the one of more software components into classes including redundant software, shared software resources, non-safety-related applications, and software diagnostics.

In Example 46, the subject matter of one or more of Examples 41-45, further including instructions that, when executed by the one or more processor means, cause the device to equally allocate the subset of software components with respect to a contribution of each one of the subset of software components affected by a failure of the one or more hardware components.

In Example 47, the subject matter of one or more of Examples 41-46, further including instructions that, when executed by the one or more processor means, cause the device to fully allocate the subset of software components with respect to a contribution of a sum of the subset of software components affected by a failure of the one or more hardware components.

In Example 48, the subject matter of one or more of Examples 41-47, further including instructions that, when executed by the one or more processor means, cause the device to perform a time-based allocation of the subset of software components with respect to an average time used for execution via the subset of software components.

An apparatus as shown and described.

A method as shown and described.

CONCLUSION

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processing circuitry" or "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processing circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A device, comprising:
    a communication interface configured to receive input data corresponding to a circuit; and
    processor circuitry configured to analyze an executed safety-based application associated with the circuit, the safety-based application using one or more software components and one or more hardware components, the analysis including:
        performing, using the input data, a hardware-based safety analysis of the one or more hardware components used in accordance with the execution of the safety application to determine, for a predefined set of failure modes, a set of undetected hardware failures associated with a hardware dangerous failure rate;
        allocating, from among the one or more software components, a subset of software components that are affected by the one or more hardware components associated with the set of undetected hardware failures;
        performing, using the allocated subset of software components, a software-based safety analysis in accordance with a predefined set of criteria and a predefined classification of the one or more software components to calculate an ideal diagnostic coverage (DC) estimate provided by application-oriented safety measures associated with execution of the safety-based application;
        calculating a partial DC estimate based upon a weighted sum of individual contributions of each one of the allocated subset of software components to each one of the set of undetected hardware failures; and
        calculating a total DC estimate based upon the ideal DC estimate, the partial DC estimate, and the hardware dangerous failure rate.

2. The device of claim 1, wherein the processor circuitry is further configured to analyze the safety-based application based upon a redundant execution of the safety-based application on the circuit using reciprocal cross comparison by software, and
    wherein the predefined set of criteria includes software analysis criteria for the reciprocal cross comparison by software.

3. The device of claim 1, wherein the processor circuitry is further configured to perform the hardware-based safety analysis in accordance with a failure modes, effects, and diagnostic analysis (FMEDA).

4. The device of claim 1, wherein the processor circuitry is further configured to perform the software-based safety analysis in accordance with a failure modes, effects, and diagnostic analysis (FMEDA) with respect to the subset of software components that are affected by the one or more hardware components associated with the set of undetected hardware failures.

5. The device of claim 1, wherein the predefined classification of the one or more software components includes a classification of the one of more software components into classes including redundant software, shared software resources, non-safety-related applications, and software diagnostics.

6. The device of claim 1, wherein the processor circuitry is further configured to equally allocate the subset of software components with respect to a contribution of each one of the subset of software components affected by a failure of the one or more hardware components.

7. The device of claim 1, wherein the processor circuitry is further configured to fully allocate the subset of software components with respect to a contribution of a sum of the subset of software components affected by a failure of the one or more hardware components.

8. The device of claim 1, wherein the processor circuitry is further configured to perform a time-based allocation of the subset of software components with respect to an average time used for execution.

9. A device, comprising:
    a memory configured to store computer-readable instructions; and
    one or more processors configured to execute the computer-readable instructions stored in the memory to:
    receive input data corresponding to a circuit; and
        analyze an executed safety-based application associated with the circuit, the safety-based application using one or more software components and one or more hardware components, the analysis including:
            performing, using the input data, a hardware-based safety analysis of the one or more hardware components used in accordance with the execution of the safety application to determine, for a predefined set of failure modes, a set of undetected hardware failures associated with a hardware dangerous failure rate;
            allocating, from among the one or more software components, a subset of software components that are affected by the one or more hardware components associated with the set of undetected hardware failures;
            performing, using the allocated subset of software components, a software-based safety analysis in accordance with a predefined set of criteria and a predefined classification of the one or more software components to calculate an ideal diagnostic coverage (DC) estimate provided by application-oriented safety measures associated with execution of the safety-based application;

calculating a partial DC estimate based upon a weighted sum of individual contributions of each one of the allocated subset of software components to each one of the set of undetected hardware failures; and calculating a total DC estimate based upon the ideal DC estimate, the partial DC estimate, and the hardware dangerous failure rate.

10. The device of claim 9, wherein the one or more processors are further configured to analyze the safety-based application based upon a redundant execution of the safety-based application on the circuit using reciprocal cross comparison by software, and wherein the predefined set of criteria includes software analysis criteria for the reciprocal cross comparison by software.

11. The device of claim 9, wherein the one or more processors are configured to perform the hardware-based safety analysis in accordance with a failure modes, effects, and diagnostic analysis (FMEDA).

12. The device of claim 9, wherein the one or more processors are further configured to perform the software-based safety analysis in accordance with a failure modes, effects, and diagnostic analysis (FMEDA) with respect to the subset of software components that are affected by the one or more hardware components associated with the set of undetected hardware failures.

13. The device of claim 9, wherein the predefined classification of the one or more software components includes a classification of the one of more software components into classes including redundant software, shared software resources, non-safety-related applications, and software diagnostics.

14. The device of claim 9, wherein the one or more processors are further configured to equally allocate the subset of software components with respect to a contribution of each one of the subset of software components affected by a failure of the one or more hardware components.

15. The device of claim 9, wherein the one or more processors are further configured to fully allocate the subset of software components with respect to a contribution of a sum of the subset of software components affected by a failure of the one or more hardware components.

16. The device of claim 9, wherein the one or more processors are further configured to perform a time-based allocation of the subset of software components with respect to an average time used for execution.

17. A non-transitory computer readable medium having instructions stored thereon that, when executed by one or more processors, cause the device to:

receive input data corresponding to a circuit; and analyze an executed safety-based application associated with the circuit, the safety-based application using one or more software components and one or more hardware components, the analysis including:

performing, using the input data, a hardware-based safety analysis of the one or more hardware components used in accordance with the execution of the safety application to determine, for a predefined set of failure modes, a set of undetected hardware failures;

allocating, from among the one or more software components, a subset of software components that are affected by the one or more hardware components associated with the set of undetected hardware failures;

performing, using the allocated subset of software components, a software-based safety analysis in accordance with a predefined set of criteria and a predefined classification of the one or more software components to calculate an ideal diagnostic coverage (DC) estimate provided by application-oriented safety measures associated with execution of the safety-based application;

calculating a partial DC estimate based upon a weighted sum of individual contributions of each one of the allocated subset of software components to each one of the set of undetected hardware failures; and calculating a total DC estimate based upon the ideal DC estimate, the partial DC estimate, and the hardware dangerous failure rate.

18. The non-transitory computer readable medium of claim 17, further including instructions that, when executed by the one or more processors, cause the device to analyze the safety-based application based upon a redundant execution of the safety-based application on the circuit using reciprocal cross comparison by software, and wherein the predefined set of criteria includes software analysis criteria for the reciprocal cross comparison by software.

19. The non-transitory computer readable medium of claim 17, further including instructions that, when executed by the one or more processors, cause the device to perform the hardware-based safety analysis in accordance with a failure modes, effects, and diagnostic analysis (FMEDA).

20. The non-transitory computer readable medium of claim 17, further including instructions that, when executed by the one or more processors, cause the device to perform the software-based safety analysis in accordance with a failure modes, effects, and diagnostic analysis (FMEDA) with respect to the subset of software components that are affected by the one or more hardware components associated with the set of undetected hardware failures.

21. The non-transitory computer readable medium of claim 17, wherein the predefined classification of the one or more software components includes a classification of the one of more software components into classes including redundant software, shared software resources, non-safety-related applications, and software diagnostics.

22. The non-transitory computer readable medium of claim 17, further including instructions that, when executed by the one or more processors, cause the device to equally allocate the subset of software components with respect to a contribution of each one of the subset of software components affected by a failure of the one or more hardware components.

23. The non-transitory computer readable medium of claim 17, further including instructions that, when executed by the one or more processors, cause the device to fully allocate the subset of software components with respect to a contribution of a sum of the subset of software components affected by a failure of the one or more hardware components.

24. The non-transitory computer readable medium of claim 17, further including instructions that, when executed by the one or more processors, cause the device to perform a time-based allocation of the subset of software components with respect to an average time used for execution via the subset of software components.

* * * * *